United States Patent
Romero et al.

(10) Patent No.: US 11,047,933 B2
(45) Date of Patent: Jun. 29, 2021

(54) FAST RESPONSE MAGNETIC FIELD SENSORS AND ASSOCIATED METHODS FOR REMOVING UNDESIRABLE SPECTRAL COMPONENTS

(71) Applicant: Allegro MicroSystems, LLC, Manchester, NH (US)

(72) Inventors: Hernán D. Romero, Buenos Aires (AR); Roman Prochazka, Struharov (CZ); Martin Drinovsky, Horomerice (CZ)

(73) Assignee: Allegro MicroSystems, LLC, Manchester, NH (US)

( * ) Notice: Subject to any disclaimer, the term of this patent is extended or adjusted under 35 U.S.C. 154(b) by 150 days.

(21) Appl. No.: 16/372,603

(22) Filed: Apr. 2, 2019

(65) Prior Publication Data
US 2020/0319272 A1    Oct. 8, 2020

(51) Int. Cl.
| | |
|---|---|
| *G01R 33/07* | (2006.01) |
| *H03F 3/00* | (2006.01) |
| *H03H 19/00* | (2006.01) |
| *G01R 33/00* | (2006.01) |

(52) U.S. Cl.
CPC ....... *G01R 33/075* (2013.01); *G01R 33/0041* (2013.01); *G01R 33/077* (2013.01); *H03F 3/005* (2013.01); *H03H 19/004* (2013.01)

(58) Field of Classification Search
CPC .... G01R 33/075; G01R 33/077; G01R 33/07; G01R 33/0041; H03F 2200/261; H03F 2200/408; H03F 2203/45512; H03F 2203/45551; H03F 3/005; H03F 3/387; H03F 3/45475; H03F 1/26; H03F 3/45977; H03H 19/004; H03M 3/376; G01B 7/02; G01B 7/023; G01B 7/04; G01B 7/046; G01B 7/14; G01B 7/31; G01B 7/305; G01B 7/312
See application file for complete search history.

(56) References Cited

U.S. PATENT DOCUMENTS

| | | | |
|---|---|---|---|
| 6,154,027 | A | 11/2000 | Alexander et al. |
| 6,522,131 | B1 | 2/2003 | Hiligsmann et al. |
| 6,674,322 | B2 * | 1/2004 | Motz ............. G01R 33/07 324/251 |
| 7,292,095 | B2 | 11/2007 | Burt et al. |
| 7,764,118 | B2 | 7/2010 | Kusuda et al. |
| 7,990,209 | B2 | 8/2011 | Romero |
| 8,416,014 | B2 | 4/2013 | Romero |
| 8,542,010 | B2 | 9/2013 | Cesaretti et al. |
| 8,559,554 | B2 | 10/2013 | Vossiek et al. |
| 8,680,846 | B2 | 3/2014 | Cesaretti et al. |

(Continued)

OTHER PUBLICATIONS

Response to Communication pursuant to Rule 69 EPC dated Sep. 20, 2019 for European Application No. 18192809.4; 25 pages.

(Continued)

*Primary Examiner* — Vinh P Nguyen
(74) *Attorney, Agent, or Firm* — Daly, Crowley, Mofford & Durkee, LLP

(57) ABSTRACT

Magnetic field sensors and associated techniques use a Hall effect element in a current spinning arrangement in combination with a rippled reduction feedback network configured to reduce undesirable spectral components generated by the current spinning and other circuit elements.

50 Claims, 19 Drawing Sheets

(56) References Cited

U.S. PATENT DOCUMENTS

| | | | |
|---|---|---|---|
| 8,917,195 | B2 | 12/2014 | Motz et al. |
| 9,201,122 | B2 | 12/2015 | Cesaretti et al. |
| 9,614,481 | B2 * | 4/2017 | Ivanov .................. H03F 1/0205 |
| 9,817,083 | B2 * | 11/2017 | Romero .............. G01R 33/0041 |
| 10,444,299 | B2 * | 10/2019 | Romero ................. G01D 3/036 |
| 10,481,219 | B2 * | 11/2019 | Romero .............. H03F 3/45475 |
| 2003/0102909 | A1 | 6/2003 | Motz |
| 2003/0225539 | A1 | 12/2003 | Motz et al. |
| 2006/0202692 | A1 | 9/2006 | Tatschl et al. |
| 2007/0114988 | A1 | 5/2007 | Rossmann et al. |
| 2007/0247141 | A1 | 10/2007 | Pastre et al. |
| 2008/0094055 | A1 | 4/2008 | Monreal et al. |
| 2010/0321105 | A1 | 12/2010 | Romero |
| 2010/0327835 | A1 | 12/2010 | Archibald |
| 2011/0018533 | A1 | 1/2011 | Cesaretti et al. |
| 2011/0215955 | A1 | 9/2011 | Motz et al. |
| 2014/0077873 | A1 | 3/2014 | Motz et al. |
| 2016/0294331 | A1 | 10/2016 | Ivanov |
| 2016/0370440 | A1 | 12/2016 | Okatake et al. |
| 2019/0079143 | A1 | 3/2019 | Romero et al. |
| 2019/0079146 | A1 | 3/2019 | Romero et al. |

OTHER PUBLICATIONS

Notice of Allowance dated Aug. 16, 2019 for U.S. Appl. No. 15/700,603; 8 pages.
Amendment dated Jul. 24, 2019 for U.S. Appl. No. 16/700,603; 8 pages.
Notice of Allowance dated Aug. 7, 2019 for U.S. Appl. No. 15/897,708; 7 pages.
Amendment dated Jul. 17, 2019 for U.S. Appl. No. 15/897,708; 7 pages.
Intention of Grant dated May 8, 2020 for European Application No. 18192809.4; 7 pages.
Office Action dated Jul. 5, 2019 for U.S. Appl. No. 15/700,603; 14 pages.
Office Action dated Jun. 26, 2019 for U.S. Appl. No. 15/897,708; 14 pages.
Extended European Search Report dated Feb. 14, 2019 for EP Appl. No. 18192809.4; 9 pages.
Final Office Action dated Dec. 30, 2016 for U.S. Appl, No. 13/542,103; 10 pages.
Final Office Action dated Mar. 23, 2016 for U.S. Appl. No. 13/542,103; 30 pages.
Notice of Allowance dated Jun. 27, 2017 for U.S. Appl. No. 13/542,103; 11 pages.
Office Action dated Jun. 30, 2016 for U.S. Appl. No. 13/542,103; 34 pages.
Office Action dated Jul. 6, 2015 for U.S. Appl. No. 13/542,103; 36 pages.
Preliminary Amendment filed on Mar. 13, 2019 for U.S. Appl. No. 15/700,603; 8 pages.
Preliminary Amendment filed on Sep. 14, 2017 for U.S. Appl. No. 15/700,603; 7 pages.
Restriction Requirement dated Jul. 10, 2014 for U.S. Appl. No. 13/542,103; 5 pages.
Response to Final Office Action dated Dec. 30, 2016 filed on Mar. 23, 2017 for U.S. Appl. No. 13/542,103; 12 pages.
Response to Final Office Action dated Mar. 23, 2016 filed on Jun. 17, 2016 for U.S. Appl. No. 13/542,103; 24 pages.
Response to Office Action dated Jun. 30, 2016 filed on Sep. 21, 2016 for U.S. Appl. No. 13/542,103; 24 pages.
Response to Office Action dated Jul. 6, 2015 filed on Nov. 17, 2015 for U.S. Appl. No. 13/542,103; 21 pages.
Response to Restriction Requirement filed on Sep. 29, 2014 for U.S. Appl. No. 13/542,103; 1 page.
ACLM "Spectral Line" in US Patent Collection; download from http://patft.uspto.gov on Jul. 1, 2016; 3 pages.
"Amplitude Modulation with Square-Waves"; by Professor Bernd-Peter Paris; dated Mar. 3, 1998; downloaded from www.spec.gmu.edu on Jul. 5, 2016; 1 page.
"Amplitude Modulation"; downloaded from https://en.wiipedia.org on Jul. 5, 2016; 12 pages.
"Amplitude Modulation"; downloaded from https://en.wikipedia.org/wiki/Amplitude_modulation on Mar. 9, 2017; 11 pages.
Cesaretti et al.; "Circuits and Methods for Self-Calibrating or Self-Testing a Magnetic Field Sensor;" U.S. Appl. No. 13/095,371, filed Apr. 27, 2011; 62 pages.
"Communication Systems/Amplitude Modulation;" downloaded from https://en.wilpedia.org on Jul. 5, 2016; 14 pages.
"Communication Systems/Amplitude Modulation"; downloaded from https://en.wikibooks.org/wiki/Communication_Systems/Amplitude_Modulation on Mar. 9, 2017; 14 pages.
"FFT Fundamentals (Sound and Vibration Measurement Suites"; Nov. 2008 edition; downloaded from http://zone.ni.com on Jul. 1, 2016; 4 pages.
"Frequency Domain"; downloaded from https://en.wiipedia.org on Jun. 30, 2016; 3 pages.
"Frequency Domain"; downloaded from htttbs://en.wikipedia.org/wiki/Frequency__domain on Mar. 9, 2017; 3 pages.
"Johnson-Nyquist noise"; downloaded from https://en.wiipedia.org on Jul. 5, 2016; 7 pages.
"Johnson-Nyguist noise"; downloaded from https://en.wikipedia.org/wiki/Johnson%E2%80%93Nyquist_noise on Mar. 9, 2017; 7 pages.
"Multipliers vs. Modulators" by James Bryant Analog Dialogue 47-06, Jun. 1, 2013; 2 pages.
"Quantization (signal processing)"; downloaded from https://en.wikipedia.org/wiki/Quantization_(signal_processing) on Mar. 9. 2017; 13 pages.
"Quantization (signal processing)"; downloaded from https://en.wiipedia.org on Jul. 5, 2016; 15 pages.
"Spectral Analysis of Signals", by Petre Stoica and Randolph Moses; 2005 edition Chapter 4; 65 pages.
"Spectral Density"; downloaded from https://en.wiipedia.org on Jun. 30, 2016; 9 pages.
"Spectral Density"; downloaded from https://en.wikipedia.org/wiki/Spectral_density on Mar. 9, 2017; 9 pages.
"Spectral Lines", downloaded from http://www.cv.nrao.edu on Jul. 1, 2016; 10 pages.
"Speech Acoustics: Spectral Analysis of Sound"; by Robert Mannell; downloaded from http://clas.mq.edu.au on Jul. 1, 2016; 10 pages.
Smith; "Chapter 9: Applications of the DFT/Spectral Analysis of Signals:" The Scientist and Engineer's Guide to Digital Signal Processing, Spectral Analysis Signals; Jan. 1, 1997; 11 pages.
Wu et al.; "A Chopper Current-Feedback Instrumentation Amplifier with a 1mHz 1/f Noise Corner and an AC-Coupled Ripple-Reduction Loop;" 2009 IEEE International Solid-State Circuits Conference; ISSCC 2009/Session 19/Analog Techniques/19.1; Feb. 2009; 3 pages.
Amendment filed on Mar. 23, 2017 for U.S. Appl. No. 13/542,103; 12 pages.
Request for Continued Examination filed on Mar. 23, 2019 for U.S. Appl. No. 13/542,103; 3 pages.
Amendments to Claims dated Jan. 23, 2015 for TW Pat. Appl. No. 101123288; 14 pages.
DCMD Instruction letter dated Feb. 17, 2015 for TW Pat. Appl. No. 101123288; 2 pages.
Email from TIPLO dated Mar. 30, 2015 regarding response to office action for TW Pat. Appl. No. 101123288; 2 pages.
Email from TIPLO dated Aug. 4, 2015 for TW Pat. Appl. No. 101123288; 2 pages.
PCT International Preliminary Report and Written Opinion dated Jan. 16, 2014 for Intl. Appl. No. PCT/US2012/043275; 6 pages.

* cited by examiner

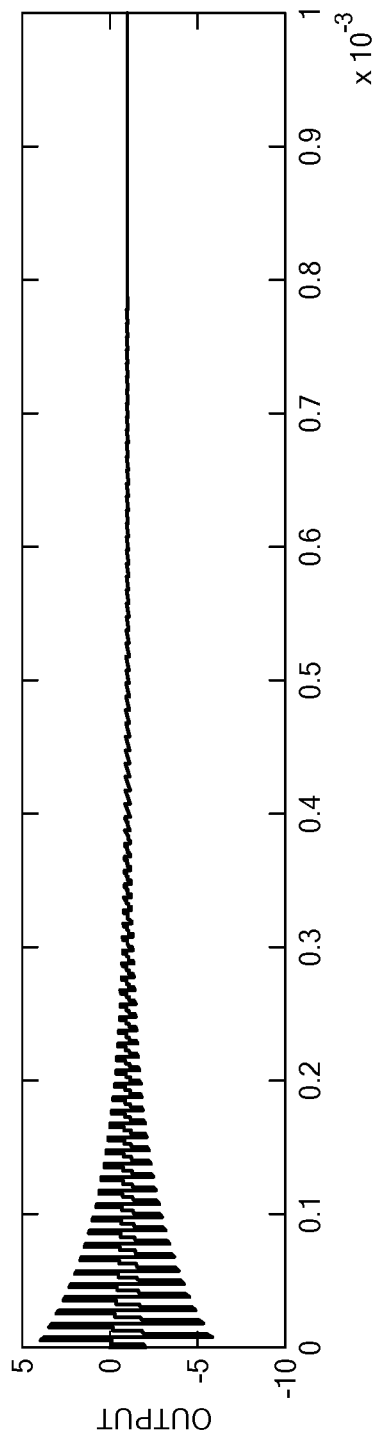
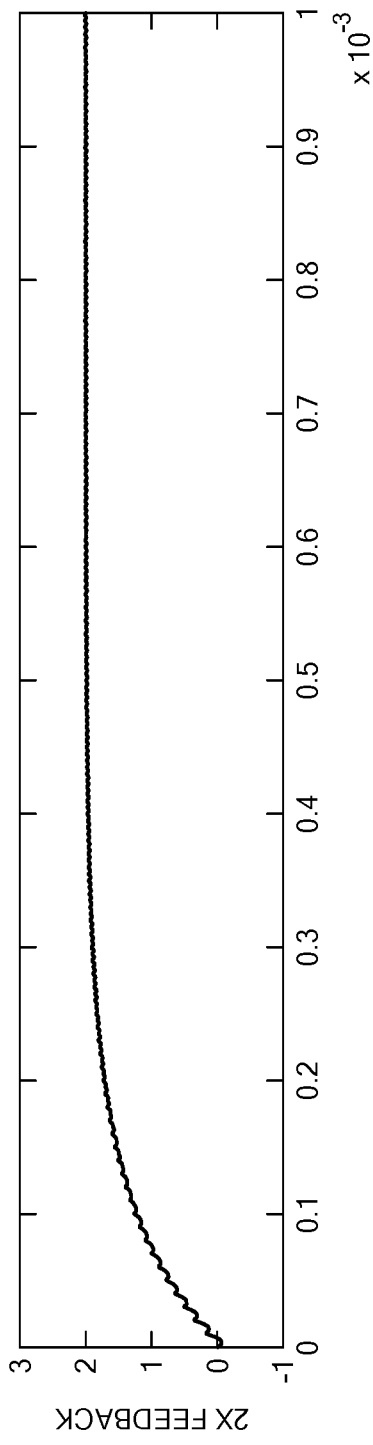
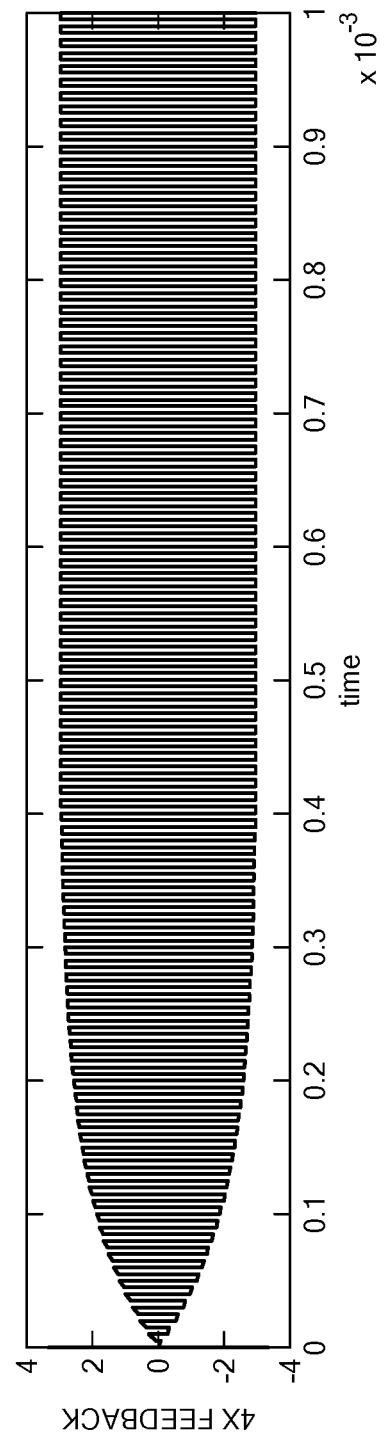
FIG. 24
FIG. 25
FIG. 26

FAST RESPONSE MAGNETIC FIELD SENSORS AND ASSOCIATED METHODS FOR REMOVING UNDESIRABLE SPECTRAL COMPONENTS

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors and, more particularly, to a magnetic field sensor having a Hall element and electronics to reduce undesirable spectral components generated when the Hall Effect element is used in a current spinning arrangement.

BACKGROUND OF THE INVENTION

As is known, there are a variety of types of magnetic field sensing elements, including, but not limited to, Hall Effect elements, magnetoresistance elements, and magnetotransistors. As is also known, there are different types of Hall Effect elements, for example, planar Hall elements, vertical Hall elements, and circular vertical Hall elements (CVH). As is also known, there are different types of magnetoresistance elements, for example, anisotropic magnetoresistance (AMR) elements, giant magnetoresistance (GMR) elements, tunneling magnetoresistance (TMR) elements, Indium antimonide (InSb) elements, and magnetic tunnel junction (MTJ) elements.

Hall Effect elements generate an output voltage proportional to a magnetic field. In contrast, magnetoresistance elements change resistance in proportion to a magnetic field. In a circuit, an electrical current can be directed through the magnetoresistance element, thereby generating a voltage output signal proportional to the magnetic field.

Magnetic field sensors, which use magnetic field sensing elements, are used in a variety of applications, including, but not limited to, a current sensor that senses a magnetic field generated by a current carried by a current-carrying conductor, a magnetic switch (also referred to herein as a proximity detector) that senses the proximity of a ferromagnetic or magnetic object, a rotation detector that senses passing ferromagnetic articles, for example, gear teeth, and a magnetic field sensor that senses a magnetic field density of a magnetic field. Particular magnetic field sensor arrangements are used as examples herein. However, the circuits and techniques described herein apply also to any magnetic field sensor.

It is known that Hall Effect elements exhibit an undesirable DC offset voltage. Techniques have been developed to reduce the DC offset voltage, while still allowing the Hall Effect element to sense a DC magnetic field. One such technique is commonly referred to as "current spinning." Current spinning is a technique by which a Hall Effect element is driven in two or more different current directions, and outputs are received at different output terminals as the Hall Effect element is differently driven. With current spinning, offset voltages of the different driving arrangements tend to cancel toward zero.

Chopping (also called square wave modulation) is a technique that alternates between a signal and an inverted signal. This will be recognized as being equivalent to alternating between multiplying a signal by plus one and by minus one.

The current spinning tends to generate undesirable spectral components (i.e., frequency components in the frequency domain). Similarly, chopping in combination with amplifiers that have DC offset can also create undesirable spectral components. The undesirable spectral components can be removed with filters.

Circuits that current spin a Hall element, chop and amplify the current spun Hall element signal, and that use one or more filters to remove undesirable spectral components are described in U.S. patent application Ser. No. 13/095,371, filed on Apr. 27, 2011, entitled "Circuits and Methods for Self-Calibrating or Self-Testing a Magnetic Field Sensor," assigned to the assignee of the present invention, and which is incorporated by reference herein in its entirety. Circuits that current spin a Hall element, chop and amplify the current spun Hall element signal, and that use one or more feedback circuits to remove undesirable spectral components are described in U.S. patent application Ser. No. 13/542,103, filed on Jul. 5, 2012, entitled "Magnetic Field Sensors And Associated Methods For Removing Undesirable Spectral Components," assigned to the assignee of the present invention, and which is incorporated by reference herein in its entirety.

While conventional arrangements that use filters can effectively reduce the undesirable spectral components, it will be understood that the filters tend to reduce a bandwidth or a response time of the magnetic field sensors that use filters. Further, while conventional arrangements that use feedback circuits can effectively reduce the undesirable spectral components, the prior art arrangements also suffer from reduced bandwidths for reasons described below.

It would be desirable to provide a magnetic field sensor that uses a Hall Effect element in a current spinning arrangement, followed by chopping (i.e., square wave modulation) and amplifier circuits, and that can reduce undesirable spectral components generated by the current spinning and chopping with amplifying operations, but that provides a wider bandwidth or faster response time than circuits previously known.

SUMMARY OF THE INVENTION

The present invention provides a magnetic field sensor that uses a Hall Effect element in a current spinning arrangement, followed by chopping (i.e., square wave modulation) and amplifier circuits, and that can reduce undesirable spectral components generated by the current spinning and chopping with amplifying operations, but that provides a wider bandwidth or faster response time than circuits previously known.

In accordance with an example useful for understanding an aspect of the present invention, a magnetic field sensor can include a magnetic field sensing element configured to generate an electronic signal in response to a magnetic field. The magnetic field sensor can also include an N-phase modulator coupled to the electronic signal and configured to generate an N-phase modulated signal having a plurality of frequency components at different frequencies, wherein the plurality of frequency components comprises a first undesirable frequency component and a desirable frequency component, wherein the desirable frequency component comprises a magnetic field signal representative of the magnetic field. The magnetic field sensor can also include a primary circuit path. The primary circuit path can include a combining module having a plurality of combining circuit input nodes and a combining circuit output node, a first one of the plurality of combining circuit input nodes coupled to a signal representative of the N-phase modulated signal. The primary signal path can also include a primary circuit path output node, wherein an output signal representative of the magnetic field signal is generated at the primary circuit path output node. The primary circuit path can also include a primary circuit path intermediate node, wherein the primary circuit path intermediate node is coupled between the combining circuit output node and the primary circuit path output node. The magnetic field sensor can also include a ripple reduction feedback network coupled between the primary circuit path intermediate node and the plurality of combining circuit input nodes, wherein the ripple reduction feedback network comprises a first ripple reduction feedback circuit configured to generate a first ripple reduction feedback signal coupled to a first one of the plurality of combining circuit input nodes, wherein the combining circuit is configured to add the first ripple reduction feedback signal to the primary circuit path to cancel the first undesirable frequency component from the primary circuit path.

In accordance with another example useful for understanding another aspect of the present invention, a method can include generating an electronic signal with a magnetic field sensing element in response to a magnetic field. The method can also include generating an N-phase modulated signal with an N-phase modulator, the N-phase modulated signal having a plurality of frequency components at different frequencies, wherein the plurality of frequency components comprises a first undesirable frequency component and a desirable frequency component, wherein the desirable frequency component comprises a magnetic field signal representative of the magnetic field. The method can also include processing the N-phase modulated signal with a primary circuit path. The primary circuit path can include a combining circuit having a plurality of combining circuit input nodes and a combining circuit output node, a first one of the plurality of combining circuit input nodes coupled to a signal representative of the N-phase modulated signal. The primary circuit path can also include a primary circuit path output node, wherein an output signal representative of the magnetic field signal is generated at the primary circuit path output node. The primary circuit path can also include a primary circuit path intermediate node, wherein the primary circuit path intermediate node is coupled between the combining circuit output node and the primary circuit path output node. The method can also include generating, with a first ripple reduction feedback circuit within a ripple reduction feedback network coupled between the primary circuit path intermediate node and a first one of the plurality of combining circuit input nodes, a first ripple reduction feedback signal. The method can also include adding, with the combining circuit, the first ripple reduction feedback signal to the primary circuit path to cancel the first undesirable frequency component from the primary circuit path.

BRIEF DESCRIPTION OF THE DRAWINGS

The foregoing features of the invention, as well as the invention itself may be more fully understood from the following detailed description of the drawings, in which:

FIG. 24 is a graph showing an illustrative time behavior of an output signal generated by the magnetic field sensors of FIGS. 3 and 4 for a time period beginning at startup of the magnetic field sensors and for the magnetic field sensed by the magnetic field sensors the contains only the DC component;

FIG. 25 is a graph showing an illustrative time behavior of one of the signals within the magnetic field sensors of FIGS. 3 and 4 for a time period beginning at startup;

FIG. 26 is a graph showing an illustrative time behavior of another one of the signals within the magnetic field sensors of FIGS. 3 and 4 for a time period beginning at startup;

DETAILED DESCRIPTION OF THE INVENTION

Figure 1:
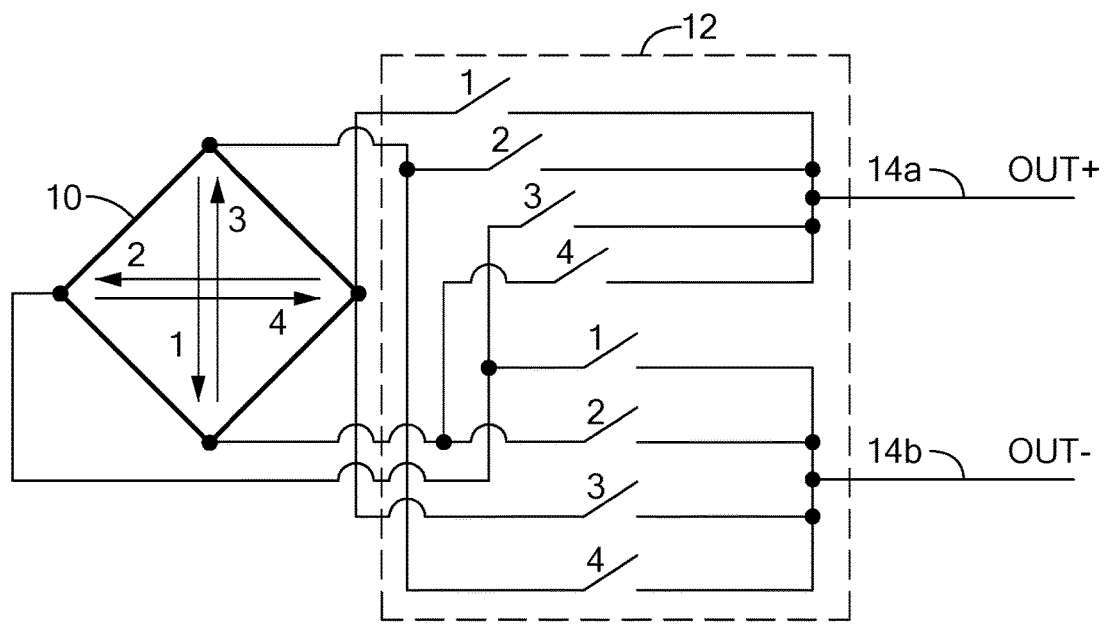
FIG. 1 is a block diagram showing a Hall Effect element and a switching circuit coupled in a four-phase chopping arrangement.

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe an assembly that uses a magnetic field sensing element in combination with an electronic circuit, all disposed upon a common substrate, e.g., a semiconductor substrate. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "magnetic field signal" is used to describe any circuit signal that results from a magnetic field experienced by a magnetic field sensing element.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be analog or digital.

As used herein, the term "module" can be used to describe a "processor." However, the term "module" is used more generally to describe any circuit that can transform an input signal into an output signal that is different than the input signal.

A processor can contain internal processors or internal modules that perform portions of the function, operation, or sequence of operations of the processor. Similarly, a module can contain internal processors or internal modules that perform portions of the function, operation, or sequence of operations of the module.

While electronic circuits shown in figures herein may be shown in the form of analog blocks or digital blocks (e.g. processors or modules), it will be understood that the analog blocks can be replaced by digital blocks (e.g. processors or modules) that perform the same or similar functions and the digital blocks can be replaced by analog blocks that perform the same or similar functions. Analog-to-digital or digital-to-analog conversions may not be explicitly shown in the figures, but should be understood.

As used herein, the term "active electronic component" is used to describe an electronic component that has at least one p-n junction that is used in the operation of the active component. A transistor, a diode, and a logic gate are examples of active electronic components. In contrast, as used herein, the term "passive electronic component" as used to describe an electronic component that does not have at least one p-n junction used in operation of the passive electronic circuit. A capacitor and a resistor are examples of passive electronic components.

As used herein, the term "amplifier" is used to describe a circuit element with a gain greater than one, less than one, or equal to one.

A used herein, the term "modulator" is used to describe a circuit or processor that can perform a time domain multiplication of a first signal by a second signal to result in an output signal that has a spectral line(s) corresponding to the first signal but shifted in frequency.

As used herein, the term "switching circuit" depending upon context, is used to describe a circuit or processor that can function as a modulator. For example, a square wave modulator is a known switching circuit that can multiply a two-state binary signal by an analog signal. Thus, the switching circuit can be a square wave modulator that alternates between multiplying a signal by plus one and minus one. The switching circuit can also be referred to as a chopping circuit that performs a chopping operation.

Switching circuit (modulators) are shown as separate blocks herein. However, in other embodiments, the switching function (modulation) can be within one of the amplifiers that are also shown herein.

Switching circuits are shown that can perform square wave modulation. However, in other embodiments, the switching circuit modulators can be replaced by four quadrant multiplier that can multiply two signals together.

As used herein, the term "frequency component," "spectral component," and "signal component" are used to describe parts (components) of a signal in the frequency domain. The parts of the signal can be narrowband (e.g., zero bandwidth) or can have bandwidths greater than zero.

While circuits are described below that use Hall elements in current spun arrangements, that use chopping circuits (e.g., square wave modulators) and amplifiers, and that have certain circuits to reduce undesirable spectral components resulting from the current spinning and chopping with amplifying operations, similar techniques can be used with other magnetic field sensors in order to reduce undesirable spectral components no matter what their source.

FIGS. 1-26 are the same as FIGS. 1-26 of U.S. patent application Ser. No. 13/542,103, now issued as U.S. Pat. No. 9,817,083, issued Nov. 14, 2017, which is incorporated by reference herein in its entirety.

Referring to FIG. 1, an illustrative Hall Effect element 10 is current spun by operation of an N-Phase modulator circuit 12, here shown to be a four phase modulator circuit 12. The four phase modulator circuit 12 can include a plurality of switches coupled to the Hall Effect element 10 in four different arrangements. The plurality of switches can provide a differential output signal 14a, 14b.

In operation, and in accordance with four-phase (i.e., 4×) current spinning, the Hall Effect element 10 can be driven with currents in four different directions represented by four arrows numbered 1-4. At the same time, respective pairs of the switches are closed. For example, when the current through the Hall Effect element 10 is in a direction represented by the arrow labeled 1, two switches also labeled 1 are closed and all of the other switches are open. There are four such arrangements of drive currents and pairs of switch closures indicated. For such arrangements occur in sequence, and thus, they are often referred to as current spinning phases. The current spinning phases are sequenced at a rate related to a chopping frequency, described more fully below. Let it suffice here to say that the chopping frequency is a rate at which a switching circuit (i.e., modulator) is switched. However, because the sequence rate of current spinning can be synchronous with the chopping frequency, the rate of the current spinning can be discussed in terms of the chopping frequency herein.

It will be understood that each current spinning phase in sequence contributes to the differential output signal 14a, 14b. It will also be understood that by proper sequencing of the drive currents and the switch pair closures, some components of the resulting differential output signal 14a, 14b can shift to one or more frequencies related to the chopping frequency. Depending upon phasing, the components that are shifted in frequency include either the DC offset of the Hall Effect element 10 or a signal (Bext) corresponding to a magnetic field sensed by the Hall Effect element 10.

In examples described more fully below, a current spinning phase sequence is described that results in the signal corresponding to the magnetic field sensed by the Hall Effect element being shifted to a frequency related to the chopping frequency.

Figure 2:
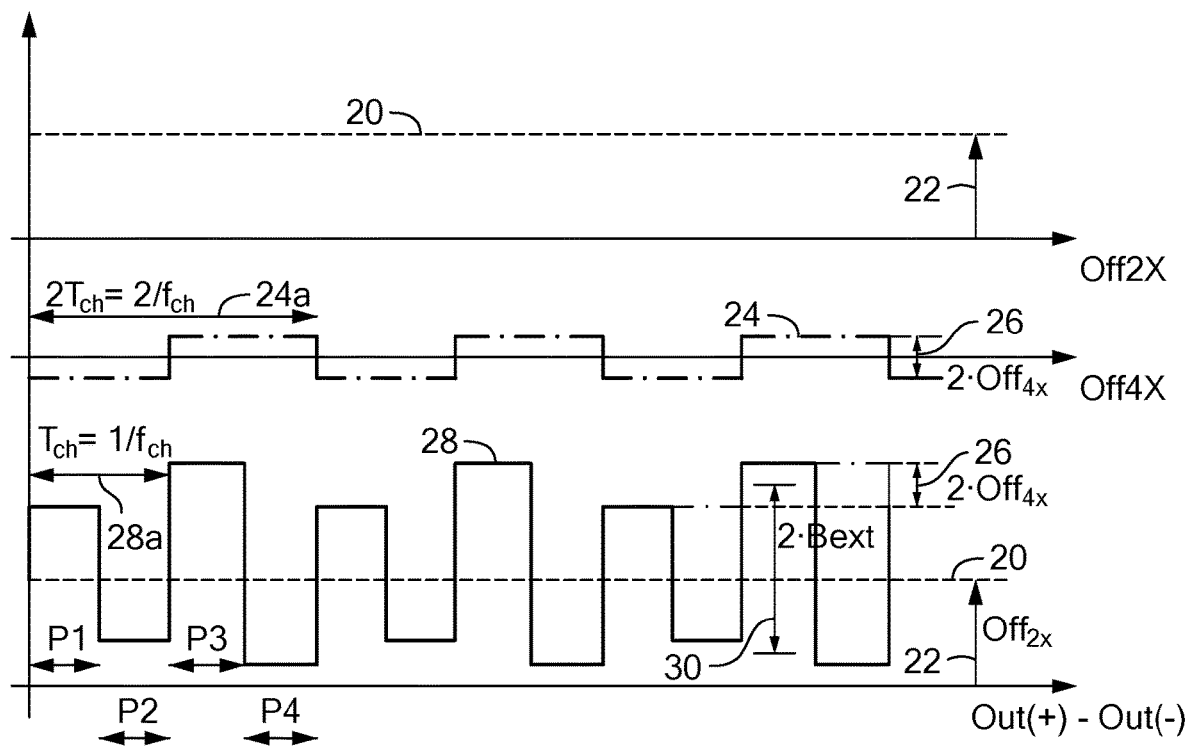
FIG. 2 is a set of graphs showing signals within the circuits of FIG. 1.

Referring now to FIG. 2, three signals, 20, 24, 28 are shown in the time domain. Horizontal axes have scales in units of time in arbitrary units and a vertical axis has a scale in units of volts in arbitrary units.

The signal 20 represents a DC offset voltage component of the Hall Effect element 10 of FIG. 1, which remains at baseband within the differential output signal 14a, 14b of FIG. 1. The DC offset voltage 20 has a magnitude 22.

The signal 24 corresponds to one of the higher frequency spectral components (occurring, for four phase current spinning, at a frequency equal to half of the chopping frequency, fchop/2 (and also at odd harmonics thereof, at lower amplitude)), but shown as an AC signal in the time domain, of the differential output signal 14a, 14b generated by the current spinning of FIG. 1. An arrow 26 is indicative of twice the amplitude of this component.

In operation of the current spinning arrangement of FIG. 1, the signals 20 and 24 exist together in combination with other spectral components.

The signal 28 includes the DC signal component 20, the AC signal component 24, and also another AC signal component corresponding to the magnetic field sensed by the Hall Effect element 10 of FIG. 1, which occurs at a frequency of fchop. An arrow 30 is indicative of twice an amplitude of the AC signal component corresponding to the magnetic field sensed by the Hall Effect element 10.

It should be appreciated that the steps of the signal 28 correspond to samples of signals generated by the Hall element 10 of FIG. 1 within the differential output signal 14a, 14b of FIG. 1 as the plurality pairs of switches close and open in sequence. As indicated, one period of the sampled signal 28 has a "chopping period," $T_{ch}=1/f_{ch}$, where $f_{ch}$ is a so-called "chopping frequency," also referred to herein as fchop. It should be appreciated that the chopping period, $T_{ch}$, corresponds to only two samples out of a four sequential samples provided by the switching circuit 12 of FIG. 1. Nevertheless, these are the conventional meanings of the chopping period and chopping frequency, fchop.

It should be understood that the AC signal component corresponding to the magnetic field sensed by the Hall effect element 10, i.e., at the frequency of fchop, is the only desired signal component within the signal 28, and the DC offset signal 20 and the AC signal component 24, at the frequency of fchop/2, are not desired. Thus, it is desirable to remove the DC component 20 and the AC signal component 24 from the signal 28. Techniques described below can remove the undesirable signal components Within the signal 28, it should be appreciated that the undesirable AC signal component 24, as shown, generates a signal component with magnitude 26. Furthermore, it should be appreciated that the undesirable DC signal component 20 generates a DC signal component with a magnitude 22, i.e., an undesirable DC offset of the signal 28.

Thus, it should be appreciated then that the signal 28 has all three signal components (and corresponding spectral components in the frequency domain), two of which are undesirable. The signal 28 can be the same as or similar to the differential signal 14a, 14b of FIG. 1.

Referring briefly to FIG. 1, for four-phase current spinning as shown, there are four clock signals controlling four respective pairs of switches within the switching circuit 12, and there are four respective directions of drive currents within the Hall element 10. With the above definition of chopping frequency, fchop, above, each clock for the four sets of switches, has a frequency of 2fchop/N, where N is a number of phases in the current spinning. For four-phase chopping, N=4, and the frequency of each one of the clocks is fchop/2. Referring again to FIG. 2, in other words, the period, $T_{ch}$, at the chopping frequency corresponds to only two of N sequential samples provided by N-phase chopping.

Figure 3:
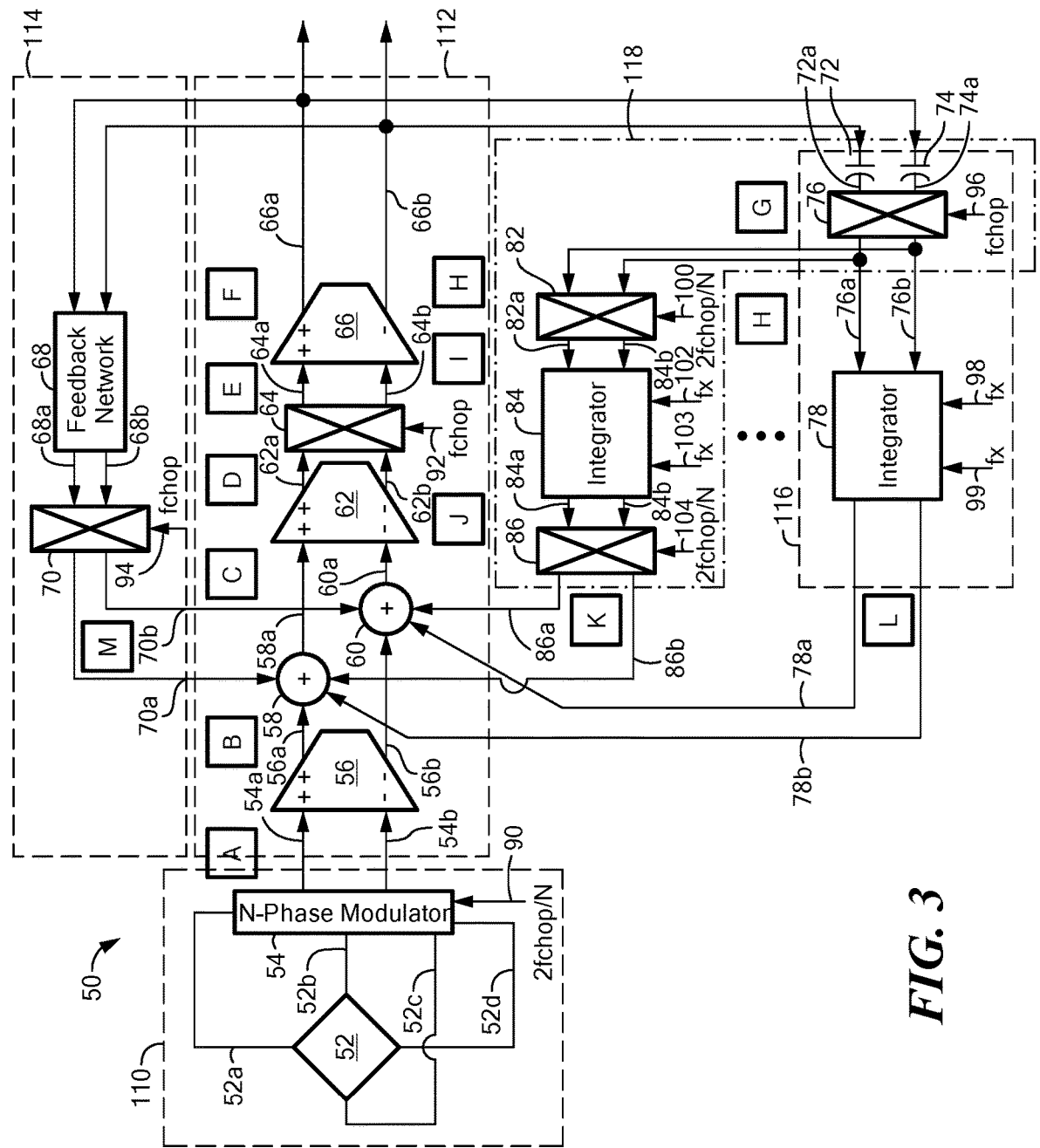
FIG. 3 is a block diagram showing an illustrative magnetic field sensor having a Hall effect element used in a current spinning arrangement, having a primary signal path with a chopping circuit (i.e. a square wave modulator) and amplifiers, and having a feedback circuit network configured to reduce undesirable spectral components in the primary signal path that results from the combined current spinning and chopping operation.

Referring now to FIG. 3, a magnetic field sensor 50 includes a Hall Effect element 52 coupled to an N-phase modulator circuit 54 in a chopped circuit 96. The Hall Effect element 52 and the N-phase modulator circuit can be the same as or similar to the Hall Effect element and the N-phase modulator 12 of FIG. 1. A generalized N-phase current spinning arrangement is shown in FIG. 3 and is also used in further examples below. It should be understood that many different current spinning arrangements can be used, including, but not limited to, a 2×, a 4×, and an 8× chopping arrangement, where N=2, 4, or 8.

The N-phase modulator circuit 54 can be configured to generate a differential output signal 54a, 54b, which can be the same as or similar to the differential output signal 14a, 14b of FIG. 1. For easy reference in figures below, the differential signal 54a, 54b is labeled as a signal A, and other differential signal described below are labeled with other letters.

A primary circuit path 112, and, in particular an amplifier 56, can be coupled to receive the differential signal 54a, 54b and configured to generate an amplified differential output signal 56a, 56b, which is labeled as a signal B. In some embodiments, the amplifier 56 is a transconductance amplifier.

A summing node 58 can be coupled to receive the signal 56a and another summing node 60 can be coupled to receive the signal 56b. The summing nodes 58, 60 can also be coupled to receive other signals described more fully below.

The summing nodes 58, 60 are configured to provide a differential signal 58a, 60a, which is labeled as a signal C.

Another amplifier 62 is coupled to receive the differential signal 58a, 60a and configured to generate an amplified signal 62a, 62b, which is labeled as a signal D. In some embodiments, the amplifier 62 is also a transconductance amplifier.

A switching circuit 64 (i.e., a modulator) can be coupled to receive the differential signal 62a, 62b and configured to generate a differential switched signal 64a, 64b, which is labeled as a signal E.

Another amplifier 66 is coupled to receive the differential switched output signal 64a, 64b and configured to generate another differential amplified signal 66a, 66b, which is labeled as a signal F. In some embodiments the amplifier 66 is a transconductance amplifier.

While transconductance amplifiers are described above, in other embodiments, the various amplifiers can be voltage amplifiers.

The differential amplified signal 66a, 66b can correspond to a differential output signal from the magnetic field sensor 50. It is desirable that the differential output signal 66a, 66b consist only of signal components directly related to that magnetic field which the Hall Effect element 52 senses, and not include undesirable signal components, for example, a DC offset component or other signal components described above in conjunction with FIG. 2.

The primary circuit path 112 can be used in conjunction with a gain feedback path 114. In general, the gain feedback path 114 is used to control and stabilize a gain of the primary circuit path 112. The gain feedback path 114 can include a feedback network 68 coupled to receive the differential output signal 66a, 66b and configured to generate a differential signal 68a, 68b. The feedback network 68 can be comprised, for example, of passive circuit elements, for example, resistors.

The gain feedback path 114 can also include a switching circuit 70 (i.e., a modulator) coupled to receive the differential signal 68a, 68b and configured to generate a differential switched signal 70a, 70b, which is labeled as a signal M. The summing circuit 58 can be coupled to receive the signal 70a, and the summing circuit 60 can be coupled to receive the signal 70b, providing a feedback arrangement.

The magnetic field sensor 50 can also include one or more feedback circuits forming a feedback network. Here shown are a first feedback circuit 116 and an Mth feedback circuit 118. Taken together, the feedback circuits 116, 118 form a so-called "feedback circuit network," which is coupled at both ends to the primary circuit path 112.

There are N/2 such feedback circuits within the feedback circuit network, where N equals the number of phases in the chopping of the Hall Effect element 52. Thus, M=N/2. For N=4, i.e., for four phase (4×) current spinning, there are two such feedback circuits within the feedback circuit network. However, for 2× current spinning, there is only one feedback circuit, i.e., the feedback circuit 116, within the feedback circuit network. As described above, there can be any number of phases in the current spinning of the Hall Effect element 52, and any resulting number of feedback circuits within the feedback circuit network.

The first feedback circuit 116 can include first and second capacitors 72, 74, respectively, coupled to receive the differential output signal 66a, 66b. At opposite ends of the two capacitors 72, 74, a differential signal 72a, 74a is generated, which is labeled as a signal G, and which has no DC signal component, since the DC component is blocked by the two capacitors 72, 74.

The first feedback circuit 116 can also include a switching circuit 76 (i.e., a modulator) coupled to receive the differential signal 72a, 74 and configured to generate a differential switched signal 76a, 76b, which is labeled as a signal H. An integrator 78 is coupled to receive the differential switched signal 76a, 76b and configured to generate a differential integrated signal 78a, 78b, which is labeled as a signal L. The summing circuit 58 can be coupled to receive the signal 78b and the summing circuit 60 can be coupled to receive the signal 78a, or vice versa.

In other embodiments, the two capacitors 72, 74 can be omitted and the DC component, shifted upward by operation of the modulator 76, can be sufficiently attenuated by the integrators 78, 84 if the integrators 78,84 have a bandwidth sufficiently less than fchop.

The Mth feedback circuit 118 can include a switching circuit 82 (i.e., a modulator) coupled to receive the differential signal 76a, 76b and configured to generate a differential switched signal 82a, 82b, which is labeled as a signal I. An integrator 84 can be coupled to receive the differential switched signal 82a, 82b and configured to generate a differential integrated signal 84a, 84b, which is labeled as a signal J. A switching circuit 86 (i.e., a modulator) can be coupled to receive the differential integrated signal 84a, 84b and configured to generate a differential switched signal 86a, 86b, which is labeled as a signal K. The summing circuit 58 can be coupled to receive the signal 86b and the summing circuit 60 can be coupled to receive the signal 78a, or vice versa.

It should be recognized that the differential signal 78a, 78b and the differential switched signal 86a, 86b are added to signals within the primary circuit path 112. It will become apparent from discussion below that the differential signal 78a, 78b can cancel some undesirable signal components within the primary circuit path 112 and, in some embodiments, the differential switched signal 86a, 86b can cancel some other undesirable signal components within the primary circuit path 112.

In some embodiments, the integrators 78, 84 are continuous, i.e., un-sampled, integrators, which can be either active or passive. Both active and passive integrator structures are known.

In other embodiments, the integrators 78, 84 can be switched capacitor integrators described more fully below in conjunction with FIG. 5B. Switched capacitor integrators require clock signals. Thus, clock signals 98, 99, 102, 103 are shown to be received by the integrators 78, 84, respectively. The clock signals 98, 99, 102, 103 can be at any frequency, fx. However, as is known, any sampled system generates nulls in their transfer function at a clock frequency and at higher harmonics thereof. Therefore, it may be desirable to select a frequency of the clock signals 98, 99, 102, 103 such that nulls occur at particular frequencies, for example, at frequencies of fchop or fchop/2. The clock signals 98, 99, 102, 103 are described more fully below in conjunction with FIG. 5C.

The switching circuits 82, 86 can be controlled by clock signals 100, 104, respectively, with frequencies of 2fchop/N. The switching circuit 76 can be controlled by a clock signal 96 with a frequency of fchop. Reasons for the selection of particular clock frequencies will become more apparent below in conjunction with FIGS. 6-23.

Operation of the magnetic field sensor 50 is described in conjunction with FIGS. 6-23 below.

Figure 4:
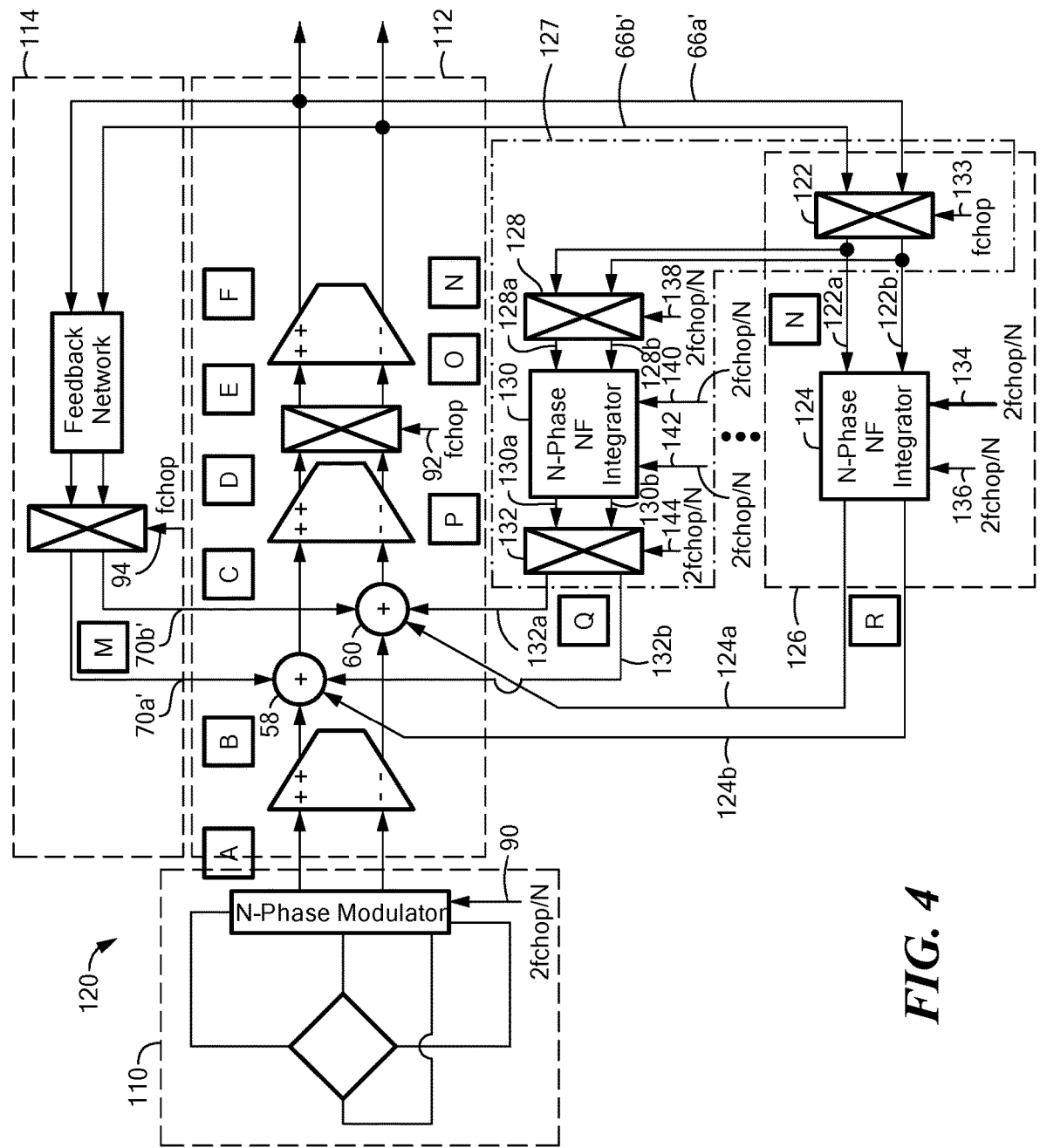
FIG. 4 is a block diagram showing another illustrative magnetic field sensor, having a primary signal path with a chopping circuit and amplifiers, having a Hall effect element used in a current spinning arrangement, and having a feedback circuit network configured to reduce undesirable spectral components that results from the current spinning.

Referring now to FIG. 4, in which like elements of FIG. 3 are shown having like reference designations, another magnetic field sensor 120 can include the current spinning circuit 110, the primary circuit path 112, and the gain feedback circuit 114. However, here shown, the differential output signal 66a', 66b' is shown with prime symbols to indicate that the differential output signal 66a', 66b' is very much like the differential output signal 66a, 66b of FIG. 3, but also that it differs slightly due to differences in feedback circuits described below. For similar reasons, the gain feedback signal 70a', 70b' is shown with prime symbols.

The magnetic field sensor 120 can include a first feedback circuit 126 and an Mth feedback circuit 127, which together form of feedback circuit network coupled at both ends to the primary circuit path 112 to form a feedback loop. As described above in conjunction with FIG. 3, M=N/2.

The first feedback circuit 126 is similar to the feedback circuit 116 of FIG. 3. However, the first feedback circuit 126 does not include capacitors 72, 74, and it also includes a different type of integrator.

The first feedback circuit 126 includes a switching circuit 122 (i.e., a modulator) coupled to receive the differential output signal 66a', 66b' and configured to generate a differential switched signal 122a, 122b, which is labeled as a signal N. An N-phase switched capacitor notch filter integrator 124 is coupled to receive the differential switched signal 122a, 122b and configured to generate a differential integrated signal 124a, 124b, which is labeled as a signal R. Examples of switched capacitor notch filter integrators can be found, for example, in U.S. Pat. No. 7,990,209, issued Aug. 2, 2011, assigned to the assignee of the present invention, and incorporated by reference herein in its entirety. Also, an example of a switched capacitor notch filter integrator is shown and described below in conjunction with FIGS. 5, 5A, and 5D.

In general, notches in the transfer function of a switched capacitor notch filter integrator can be controlled by a separate clock signal, i.e., a redistribution or averaging clock signal, apart from a primary sampling clock signal. Thus, the redistribution clock provides an enhanced ability to position notches in a corresponding transfer function, as further described below.

The summing circuit 58 can be coupled to receive the signal 124b and the summing circuit 60 can be coupled to receive the signal 124a, or vice versa.

The Mth feedback circuit 127 can include a switching circuit 128 (i.e., a modulator) coupled to receive the differential switched signal 122a, 122b and configured to generate a differential switched signal 128a, 128b, which is labeled as a signal O.

An N-phase switched capacitor notch filter integrator 130 can be coupled to receive the differential switched signal 128a, 128b and configured to generate a differential integrated signal 130a, 130b, which is labeled as a signal P. A switching circuit 132 (i.e., a modulator) can be coupled to receive the differential integrated signal 130a, 130b and configured to generate a differential switched signal 132a, 132b, which is labeled as a signal Q.

The summing circuit 158 can be coupled to receive the signal 132b and the summing circuit 60 can be coupled to receive the signal 132a.

The switched capacitor notch filter integrators 124, 130 can be coupled to receive sample clock signals 134, 138, respectively at a frequency of 2fchop/N and also redistribution clock signals 136, 140, respectively, at a frequency of 2fchop/N. The sample clock signals 134, 140 are each comprised of four clock signals at different phases. The four different phases are described more fully below in conjunction with FIGS. 5 and 5A.

The switching circuits 128, 132 can be switched with clock signals 138, 144, respectively, at a frequency of 2fchop/N. The switching circuit 122 can be switched with a clock signal 133 at a frequency of fchop. Reasons for the selection of frequencies will become more apparent below in conjunction with FIGS. 6-23.

Operation of the magnetic field sensor 120 is described in conjunction with FIGS. 6-23 below.

The N-phase switched capacitor notch filter integrators 124, 130 of FIG. 4 have particular advantages over simple integrators 78, 84 (linear or switched capacitor types) described above in conjunction with FIG. 3. It will be appreciated from discussion below in conjunction with spectral plots in FIGS. 6-23, that an ability to position notches of the N-phase switched capacitor notch filter integrators 124, 130 (e.g., by way of the redistribution clock signals described above) provides the ability to remove signal components (e.g., the magnetic field responsive signal (Bext) shifted by the modulator 76) that are not intended to be integrated. Accordingly, it will be appreciated that the AC coupling capacitors 72, 74 of FIG. 3 (which tend to remove the signal (Bext) at baseband) are not required. Furthermore, the ability to place notches at frequencies selected to remove all spectral lines that are not intended to be integrated (i.e., undesirable spectral components) avoids using an integrator with a very low cut-off integration frequency, which would otherwise be required in order to achieve a very large attenuation of those undesirable spectral components. Therefore, the equivalence of large capacitors (for achieving very low cut-off frequencies) can be achieved, but without large capacitors. Having higher cut-off frequencies allows for the feedback circuits 126, 127 to settle more rapidly, resulting in a rapid removal of the undesirable spectral components.

Figure 5:
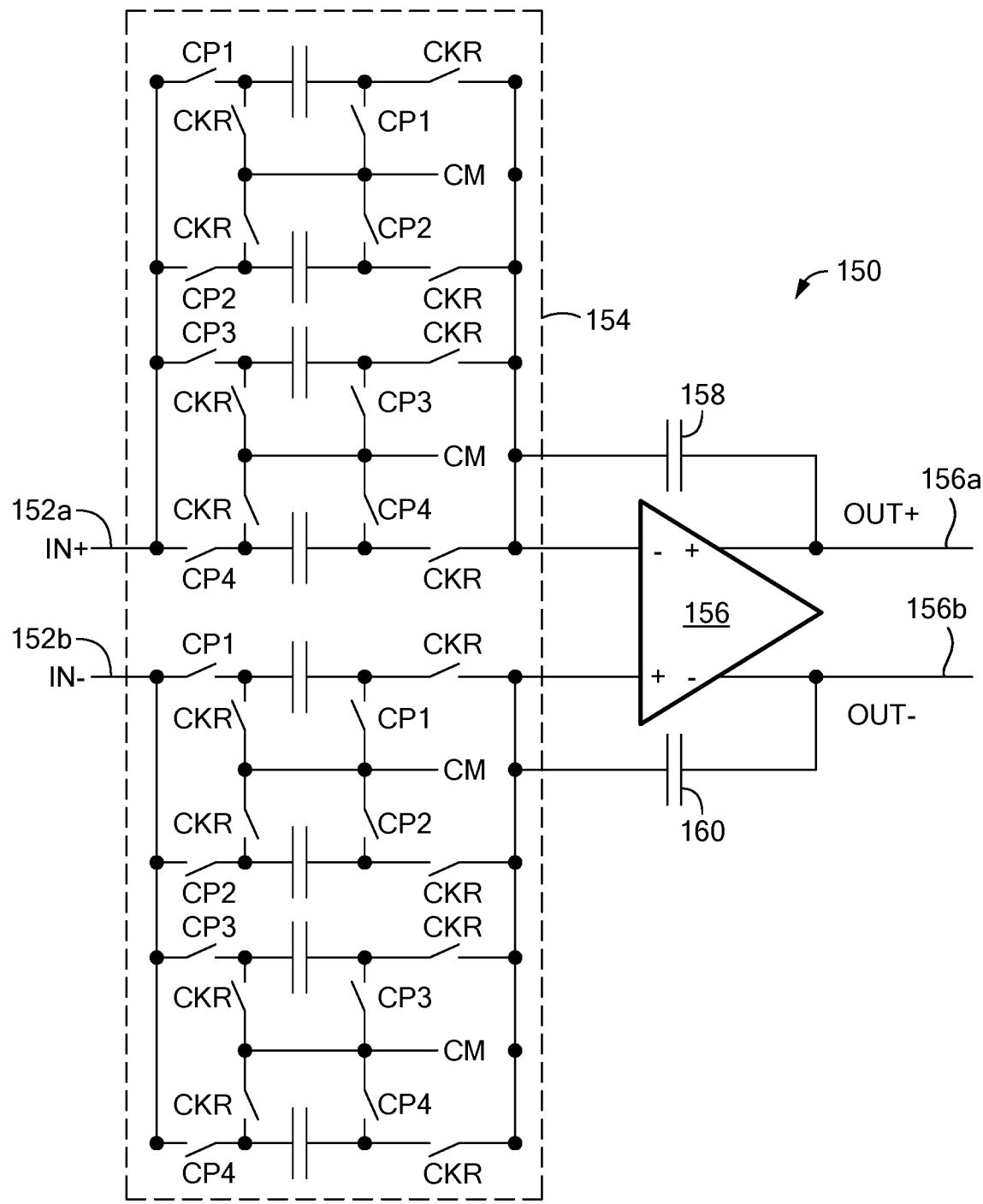
FIG. 5 is a block diagram of a four-phase switched capacitor notch filter integrator circuit.

Referring now to FIG. 5, a four-phase switched capacitor notch filter integrator 150 is representative of the N-phase switch capacitor notch filter integrator 130 of FIG. 4 for the case of 4× chopping, where N=4. The switched capacitor notch filter integrator 150 is coupled to receive a differential input signal 152a, 152b. The switched capacitor notch filter integrator 150 includes a plurality of switches and a plurality of capacitors 154 all coupled is shown, and coupled to input nodes of an amplifier 156. Some of the plurality of switches are controlled by a so-called "redistribution" clock signal, CKR. Other ones of the plurality of switches are controlled by a sample clock signals, CP1, CP2, CP3, CP4. Each one of the sample clock signals has the same frequency but occurs a different phase as described more fully below in conjunction with FIG. 5A.

The amplifier 156 is configured to generate a differential output signal 156a, 156b, which can be the same as or similar to the differential output signal 130a, 130b of FIG. 4.

A capacitor 158 is coupled between an input node of the amplifier 156 and the output signal 156a. A capacitor 160 is coupled between another input node of the amplifier 156 and the output signal 156b.

Figure 5A:
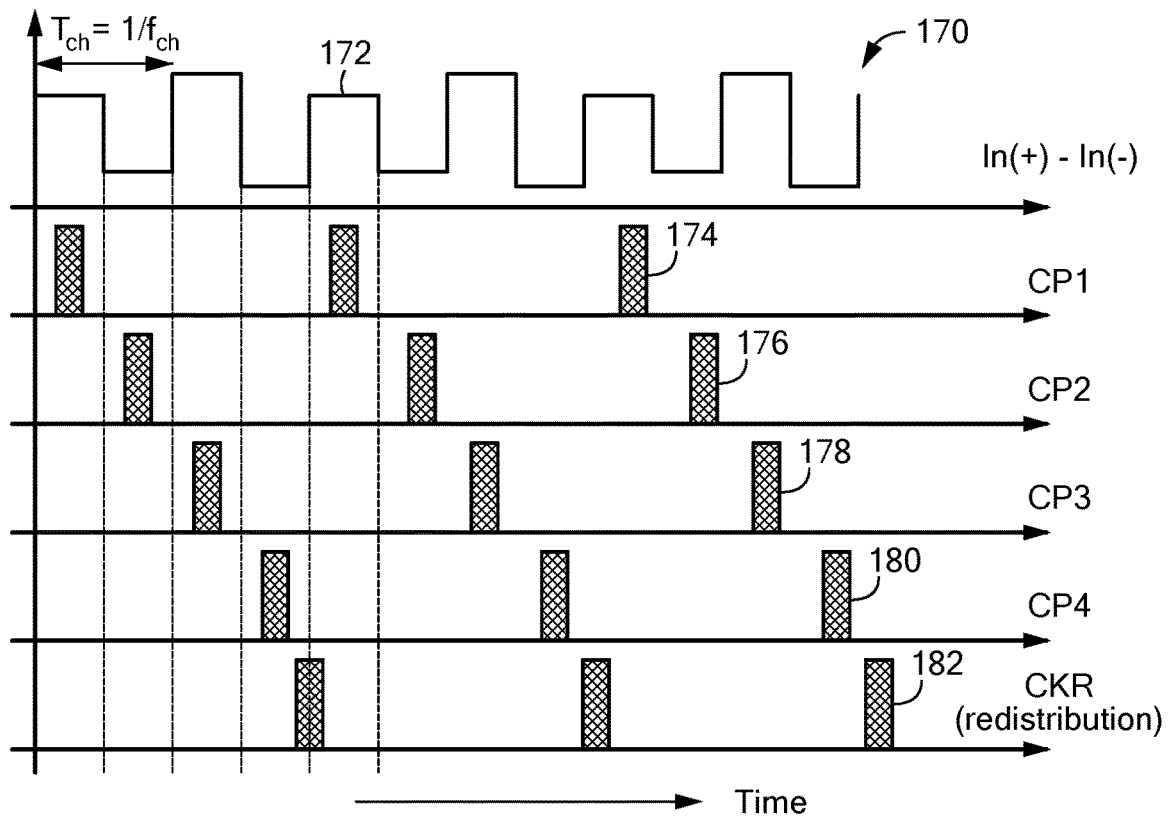
FIG. 5A is a series of graphs showing clock signals associated with the four-phase switched capacitor notch filter integrator circuit of FIG. 5.

Referring now to FIG. 5A, a graph 170 has a horizontal axis with a scale in units of time in arbitrary units and a vertical axis with a scale in units of volts in arbitrary units. A signal 172 can be the same as or similar to the differential input signal 152a, 152b of FIG. 5.

Clock signals 174, 176, 178, 180 can be the same as or similar to the sampling clock signals, CP1, CP2, CP3, CP4 of FIG. 5 and the clock signals 140 of FIG. 4. The clock signals 174, 176, 178, 180 are shown as pluralities of dark boxes representing sampling periods, however, the dark boxes are representative of switch closures of respective ones of the pairs of switches in FIG. 5. As described above the sample clock signal 140 is actually four clock signals, each at the same frequency, and each at a different phase.

A clock signal 182 can be the same as or similar to the redistribution or averaging clock signals 136, 142 of FIG. 4. The clock signal 182 is shown as a plurality of dark boxes, however, the dark boxes are representative of switch closures of respective ones of the switches in FIG. 5. In operation, at times when the redistribution clock signal 182 is high, samples associated with each one of the sample clock signals 174, 176, 178, 180 are averaged.

Figure 5B:
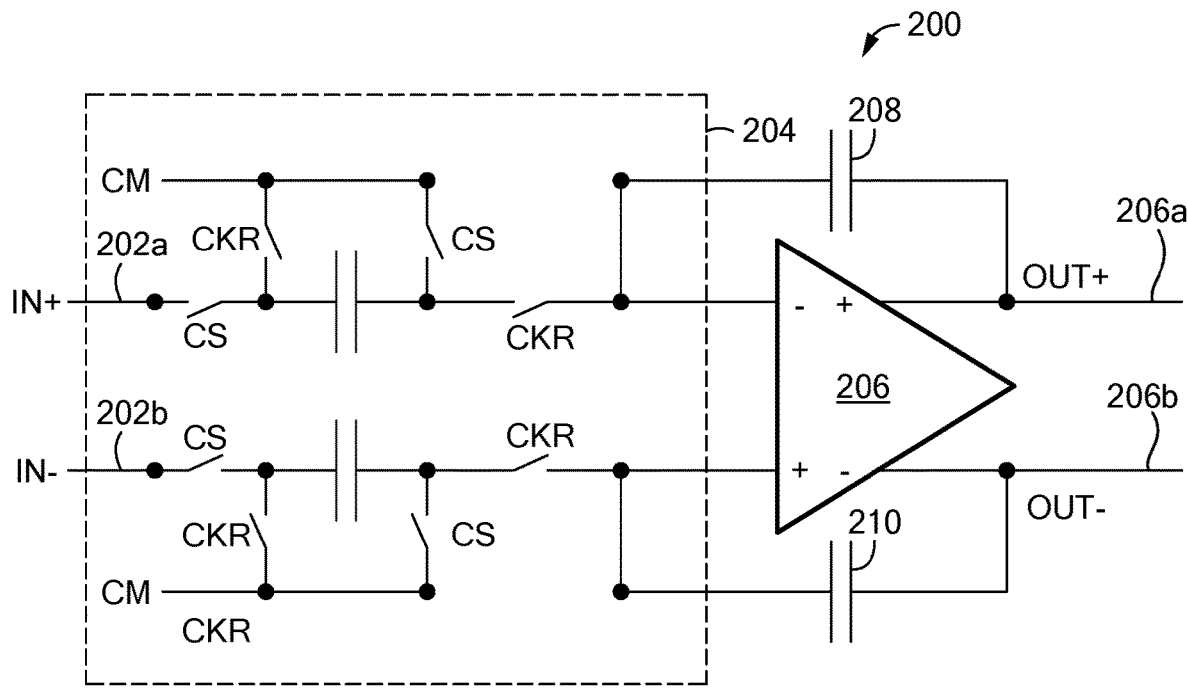
FIG. 5B is a block diagram of a conventional switched capacitor integrator circuit.

Referring now to FIG. 5B, a conventional switched capacitor integrator can be the same as or similar to the integrators 78, 84 of FIG. 3. The switched capacitor integrator 200 is coupled to receive a differential input signal 202a, 202b. The switched capacitor integrator 200 includes a plurality of switches and a plurality of capacitors 204 all coupled is shown, and coupled to input nodes of an amplifier 206. Some of the plurality of switches are controlled by a redistribution clock signal, CKR. Other ones of the plurality of switches are controlled by a sample clock signal, CS. In some embodiments, the sample clock signal and the redistribution clock signal have the same frequency but different phases.

The amplifier 206 is configured to generate a differential signal 206a, 206b, which can be the same as or similar to the differential signals 78a, 78b and 84a, 84b of FIG. 3.

A capacitor 208 is coupled between an input node of the amplifier 206 and the output signal 206a. A capacitor 210 is coupled between another input node of the amplifier 206 and the output signal 206b.

Figure 5C:
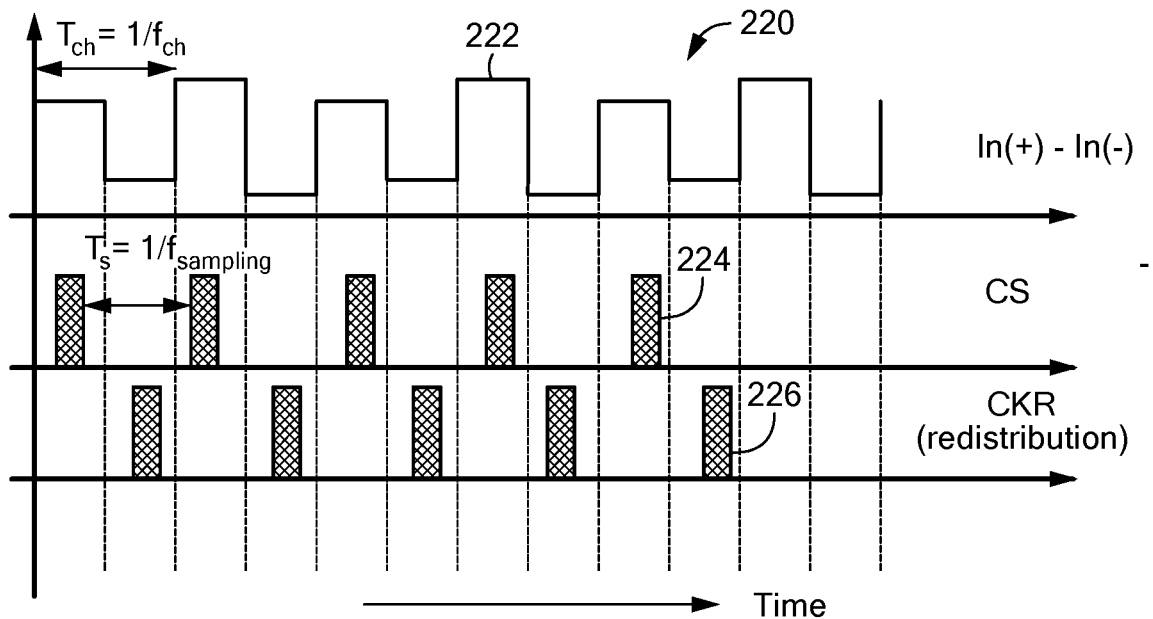
FIG. 5C is a series of graphs showing clock signals associated with the switched capacitor integrator circuit of FIG. 5B.

Referring now to FIG. 5C, a graph 220 has a horizontal axis with a scale in units of time in arbitrary units and a vertical axis with a scale in units of volts in arbitrary units. A signal 222 can be the same as or similar to the differential input signal 202a, 202b of FIG. 5B.

A clock signal 224 can be the same as or similar to the clock signal, CS, of FIG. 5B and the clock signals 98, 102 of FIG. 3. The clock signals 224 is shown as dark boxes, however, the dark boxes are representative of switch closures of respective ones of the switches in FIG. 5B.

A clock signal 226 can be the same as or similar to the redistribution or averaging clock signals 99, 103 of FIG. 3. The clock signal 226 is shown as dark boxes, however, the dark boxes are representative of switch closures of respective ones of the switches in FIG. 5B.

Figure 5D:
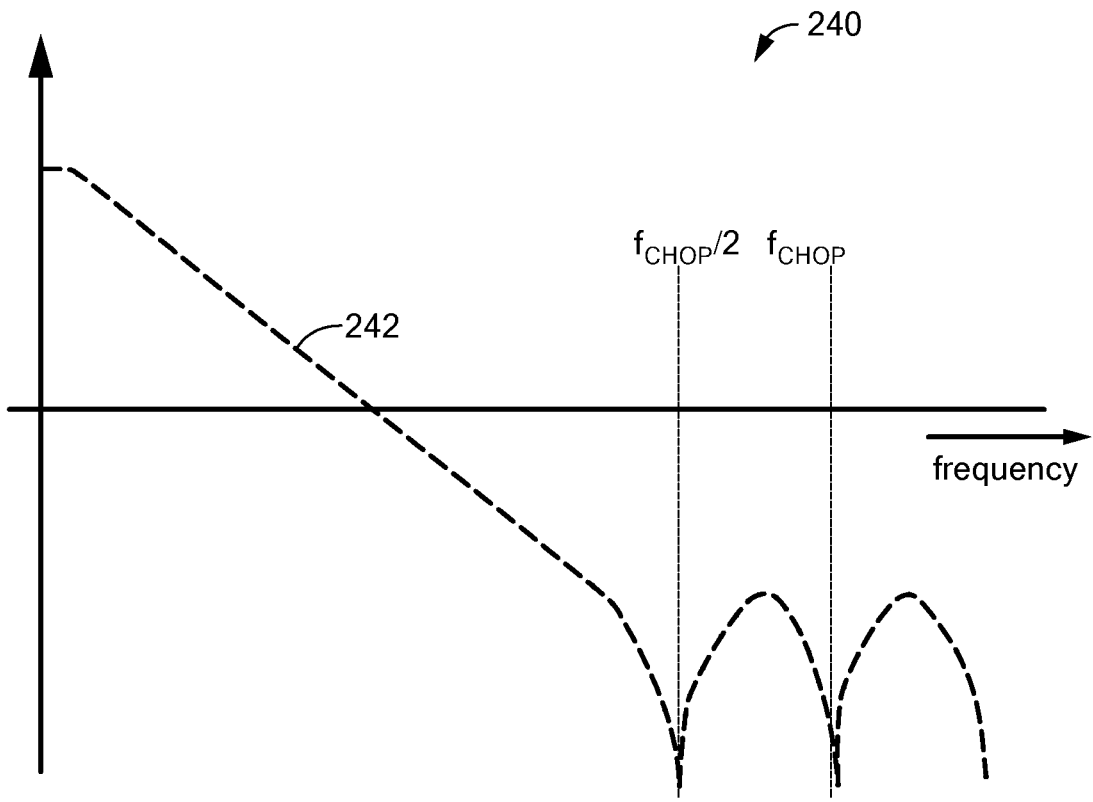
FIG. 5D is a graph showing an illustrative transfer function that can be associated with the four-phase switched capacitor notch filter integrator circuit of FIG. 5.

Referring now to FIG. 5D, a graph 240 includes a horizontal axis in units of frequency and a vertical axis in non-dimensional units. A curve 242 is indicative of a transfer function, and, in particular, a transfer function of the four-phase notch filter switched capacitor integrator 150 of FIG. 5 and, in four phase chopping arrangements, of the N-phase notch filter switched capacitor integrator 130 of FIG. 4. It will be understood that the transfer function of this integrator, and of any integrator, has a high gain at DC, and rolls off at higher frequencies. This particular transfer function rolls off at frequencies above DC at a rate generally of about dB per decade. The transfer function 242 is representative of a sin x/x (or sin c) function. A first null is shown at a frequency of fchop/2.

It will be understood that a frequency of the first null can be controlled by the redistribution clock signal 182 of FIG. 5A, the redistribution clock signal, CKR, of FIG. 5, and the redistribution clock signal 142 of FIG. 4.

It will also be understood that the curve 242 has a shape generally representative of a closed loop transfer function, for example, a closed loop transfer function of the feedback circuits 126, 127 of FIG. 4. However, the closed loop transfer function will generally have a lower gain at DC than an open loop transfer function of the N-phase notch filter switched capacitor integrator 130.

Similar circuits and transfers functions can be used for any of the N-phase notch filter switched capacitor integrators of FIG. 4.

FIGS. 6-23 show frequency domain graphs representative of signals labeled A-R in FIGS. 3 and 4, for the case of 4× chopping of the Hall Effect element 52.

In each graph, three spectral lines are shown at three respective different frequencies and amplitudes. For clarity, the spectral lines are representative of the magnetic field sensors of FIGS. 3 and 4 being exposed to an extra magnetic field with only a DC magnetic field component. However, if the magnetic field sensors are exposed to an AC external magnetic field, each one of the spectral lines will broaden into spectral bands.

At various points in the circuit three of FIGS. 3 and 4, and in various corresponding ones of FIGS. 6-23, positions of the three spectral lines change. However, the spectral lines can be identified by way of their respective amplitudes no matter at what frequency or position they are found. Gain of amplifiers is not represented in FIGS. 6-23 for clarity, in order to keep the spectral lines at the same amplitude so that they can be readily identified.

In some of the graphs, spectral lines are shown as dashed lines rather than solid lines. The dashed lines indicate that those spectral lines change with time for a time period beginning at a power up of the magnetic field sensors 50, 120 of FIGS. 3 and 4, respectively. Some of the dashed spectral lines occur at full magnitude when the magnetic field sensors 50 and 120 of FIGS. 3 and 4 first power up, and thereafter, the dashed spectral lines diminish toward zero amplitude. Others of the dashed spectral lines occur at very low magnitude when the magnetic field sensors 50 and 120 of FIGS. 3 and 4 first power up, and thereafter, the dashed spectral lines increase in magnitude. This effect is described more fully below in conjunction with FIGS. 24-26.

Figure 6:
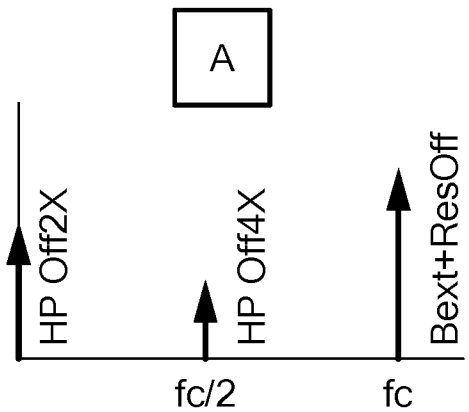
FIGS. 6-23 graphs showing spectral content of signals at various points within the magnetic field sensors of FIGS. 3 and 4, in particular, for a four-phase current spinning arrangement and for the magnetic field sensed by the magnetic field sensors that contains only a DC component.

Referring now to FIG. 6, the signal labeled A in FIGS. 3 and 4, due to chopping of the Hall element 52, has three spectral lines (an also higher order spectral lines, not shown, but at lower amplitudes). A spectral line at a frequency, fc=fchop, is a desired signal, Bext+Resoff. The desired signal is representative of an external magnetic field, here a DC magnetic field, sensed by the magnetic field sensors of FIGS. 3 and 4.

Spectral lines within the signal labeled A at DC and at a frequency, fc/2, are undesirable. The spectral line at DC is representative of one aspect of Hall element DC offset, HP Off2× (see, e.g., FIG. 2, signal 20). The spectral line at a frequency fc/2 is representative of another aspect of Hall element DC offset, HP Off4× (see, e.g., FIG. 2, signal 24).

Figure 7:
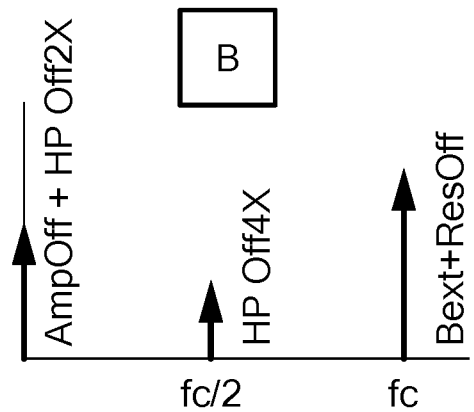

Referring now to FIG. 7, the signal labeled B in FIGS. 3 and 4 has essentially the same spectral content as the signal labeled A. The signal labeled A has passed through the amplifier 56 of FIGS. 3 and 4 to result in the signal labeled B. As described above, gain of amplifiers is not included in the graphs.

Figure 8:
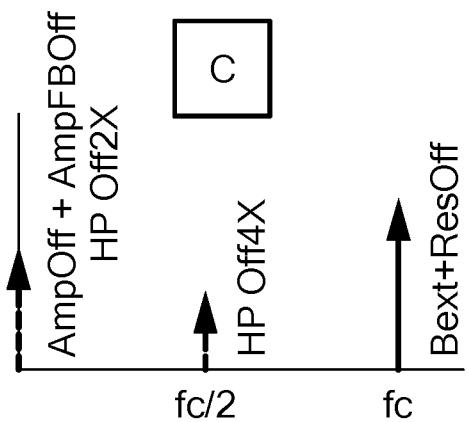

Referring now to FIG. 8, the signal labeled C in FIGS. 3 and 4 also has the same spectral content as the signals labeled A and B. However, the signal labeled C experiences spectral lines that change in amplitude for a time period after power up, i.e., spectral lines at DC and at a frequency of fc/2.

Figure 9:
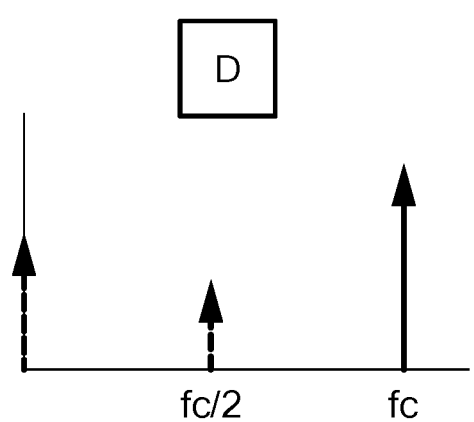

Referring now to FIG. 9, the signal labeled D in FIGS. 3 and 4 also has the same spectral content as the signals labeled A, B, and C. The signal labeled C has passed though one more amplifier 62 to result in the signal labeled D. As described above, gain of amplifiers is not included in the graphs.

Figure 10:
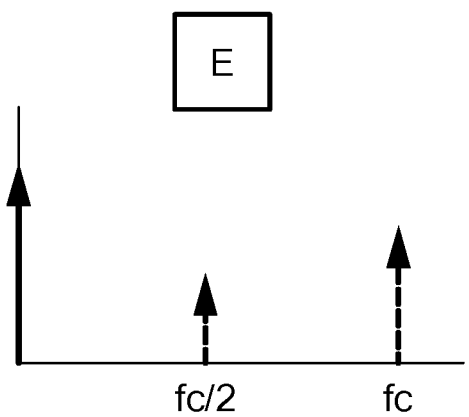

Referring now to FIG. 10, the signal labeled E in FIGS. 3 and 4 has different spectral content than the signal labeled D. The signal labeled D has passed through the switching circuit 64 to result in the signal labeled E. The switching circuit 64 operates to multiplex the signal E with the clock signal 92 at a frequency of fc=fchop. As is known, the multiplexer generates sum and difference products, resulting in the spectral content shown, in which positions of spectral lines have changed.

Figure 11:
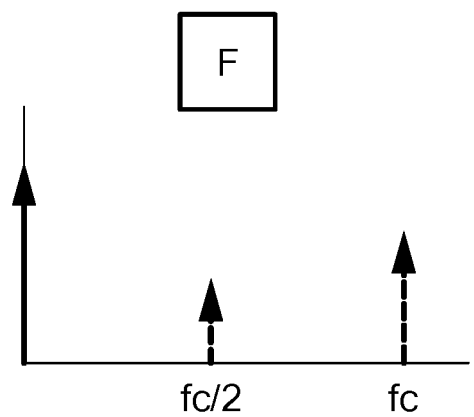

Referring now to FIG. 11, the signal labeled F in FIGS. 3 and 4 has the same spectral content as the signal labeled E. The signal labeled E has passed though one more amplifier 66 to result in the signal labeled F. As described above, gain of amplifiers is not included in the graphs.

Figure 12:
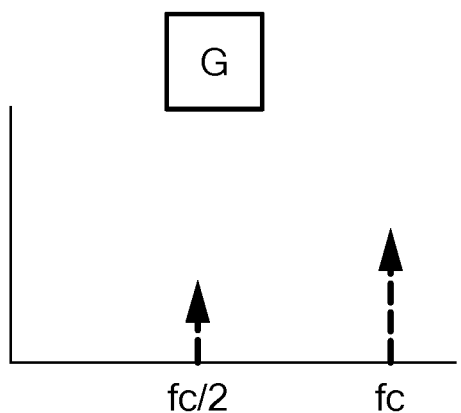

Referring now to FIG. 12, the signal labeled G in FIG. 3 has different spectral content than the signal labeled F. The signal labeled F has passed through capacitors 72, 74 to result in the signal labeled G. The capacitors remove the DC component. In some alternate embodiments, the capacitors 72, 74 are not used.

Figure 13:
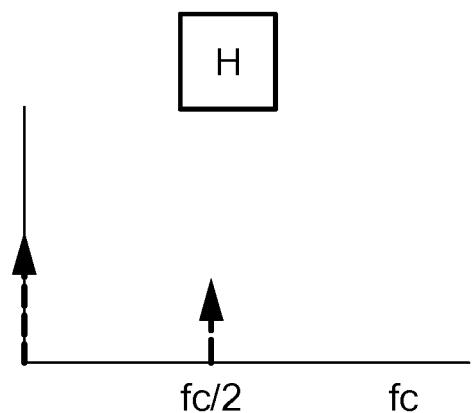

Referring now to FIG. 13, the signal labeled H in FIG. 3 has different spectral content than the signal labeled G. The signal labeled G has passed through the switching circuit 76 to result in the signal labeled H. The switching circuit 76 operates to multiplex the signal labeled G with the clock signal 96 at a frequency of fchop, resulting in the spectral content shown, in which positions of spectral lines have changed.

Figure 14:
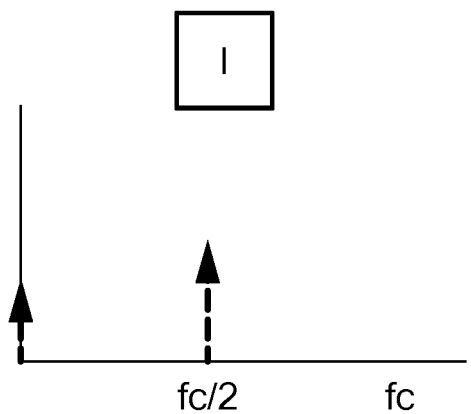

Referring now to FIG. 14, the signal labeled I in FIG. 3 has different spectral content than the signal labeled H. The signal labeled H has passed through the switching circuit 82 to result in the signal labeled I. The switching circuit 82 operates to multiplex the signal labeled H with the clock signal 100 at a frequency of 2fc/N, which is fc/2 for the case of 4× chopping, resulting in the spectral content shown, in which positions of spectral lines have changed.

Figure 15:
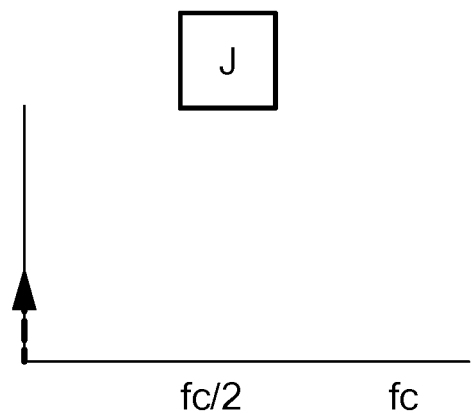

Referring now to FIG. 15, the signal labeled J in FIG. 3 has different spectral content than the signal labeled I. The signal labeled I has passed through the integrator 84, which has high gain at DC and low gain at other frequencies, to result in the signal labeled J. Thus, primarily the DC component of the signal labeled I remains in the signal labeled J.

Figure 16:
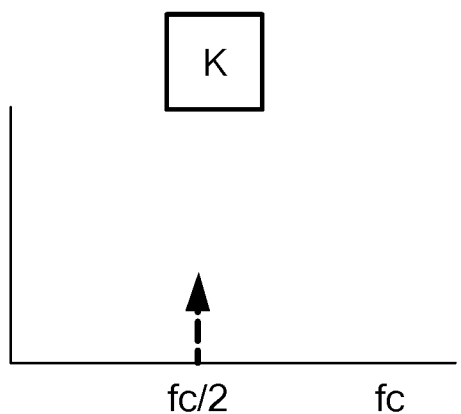

Referring now to FIG. 16, the signal labeled K in FIG. 3 has different spectral content than the signal labeled J. The signal labeled J has passed through the switching circuit 86 to result in the signal labeled K. The switching circuit 86 operates to multiplex the signal labeled J with the clock signal 100 at a frequency of 2fc/N, which is fc/2 for the case of 4× chopping, resulting in the spectral content shown, in which positions of spectral lines have changed, and only one spectral line remains, at a frequency of fc/2. The signal labeled K is summed back (see summation circuits 58, 60 of FIG. 3) into the signal labeled B of FIG. 3 at the proper phase to reduce or eliminate the spectral line in the signal labeled C at the frequency of fc/2.

Figure 17:
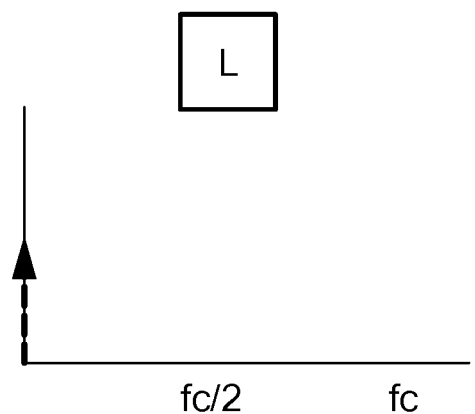

Referring now to FIG. 17, the signal labeled L in FIG. 3 has different spectral content than the signal labeled H by operation of the integrator 78, for reasons described above. The signal labeled L has spectral content primarily at DC. The signal labeled L is summed back (see summation circuits 58, 60 of FIG. 3) into the signal labeled B of FIG.

3 at the proper phase to reduce or eliminate the spectral line in the signal labeled C at DC.

By way of the signals labeled K and L, both of the undesirable spectral lines in the signal labeled C of FIG. 3 are progressively removed during a time period following power up, leaving the desired spectral line at the frequency of fc in the signal labeled C. It should be appreciated that the signal labeled F in FIG. 3 can be the output signal from the magnetic field sensor 50 of FIG. 3. Note that in FIG. F, the position of the desired spectral line has changed to DC.

As described above, the graphs of FIGS. 6-23 are representative of the magnetic field sensors of FIGS. 3 and 4 being exposed to a DC external magnetic field. If instead, the magnetic field sensors were exposed to an AC magnetic field, all of the spectral lines shown in the graphs would broaden the spectral bands. Thus, for the case of an AC external magnetic field, the remaining spectral line, shown to be at DC, would instead be a spectral band centered at DC.

Figure 18:
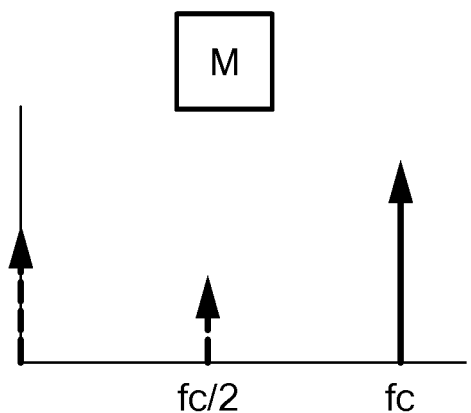

Referring now to FIG. 18, the signal labeled M in FIGS. 3 and 4 has different spectral content than the signal labeled F. The signal labeled F has passed through the switching circuit 70 to result in the signal labeled M. The switching circuit 70 operates to multiplex the signal labeled F with the clock signal 94 at a frequency of fc, resulting in the spectral content shown, in which positions of spectral lines have changed.

FIGS. 19-23 are representative of signals that appear only in FIG. 4.

Figure 19:
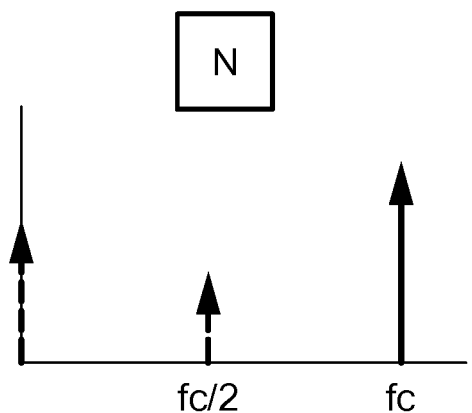
Figure 20:
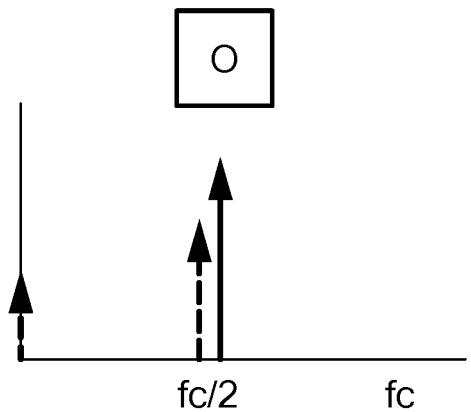

Referring now to FIG. 19, the signal labeled N in FIG. 4 has different spectral content than the signal labeled F. The signal labeled F has passed through the switching circuit 122 to result in the signal labeled N. The switching circuit 122 operates to multiplex the signal labeled F with the clock signal 133 at a frequency of fc, resulting in the spectral content shown, in which positions of spectral lines have changed Referring now to FIG. 20, the signal labeled O in FIG. 4 has different spectral content than the signal labeled N. The signal labeled N has passed through the switching circuit 128 to result in the signal labeled O. The switching circuit 128 operates to multiplex the signal labeled N with the clock signal 138 at a frequency of 2fcN, which is fc/2 for the case of 4× chopping, resulting in the spectral content shown, in which positions of spectral lines have changed.

Figure 21:
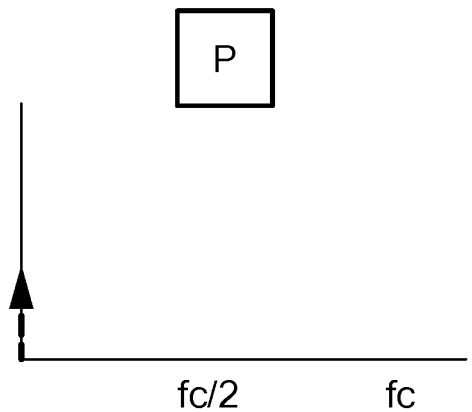

Referring now to FIG. 21, the signal labeled P in FIG. 4 has different spectral content than the signal labeled O. The signal labeled O has passed through the N-phase (here four-phase) switched capacitor notch filter integrator 130, which has high gain at DC and low gain at other frequencies, to result in the signal labeled P. Thus, primarily the DC component of the signal labeled O remains in the signal labeled P.

Figure 22:
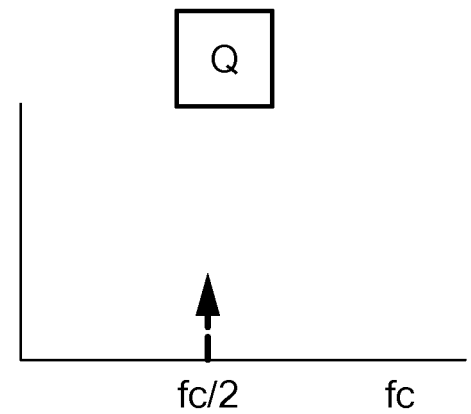

Referring now to FIG. 22, the signal labeled Q in FIG. 4 has different spectral content than the signal labeled P. The signal labeled P has passed through the switching circuit 132 to result in the signal labeled Q. The switching circuit 132 operates to multiplex the signal labeled P with the clock signal 144 at a frequency of 2fcN, which is fc/2 for the case of 4X chopping, resulting in the spectral content shown, in which positions of spectral lines have changed.

Figure 23:
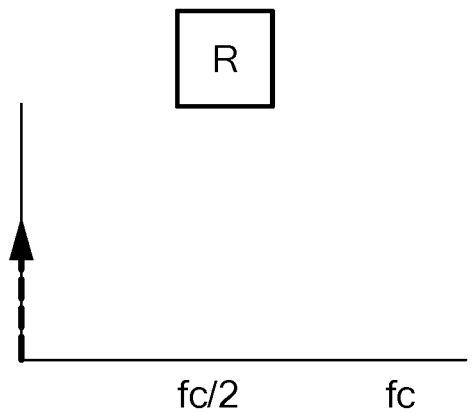

Referring now to FIG. 23, the signal labeled R in FIG. 4 has different spectral content than the signal labeled N. The signal labeled R has passed through the N-phase (here two-phase) switched capacitor notch filter integrator 124, which has high gain at DC and low gain at other frequencies. Thus, primarily the DC component of the signal labeled N remains in the signal labeled R.

By way of the signals labeled Q and R, both of the undesirable spectral lines in the signal labeled C of FIG. 4 are progressively removed, leaving the desired spectral line at the frequency of fc. It should be appreciated that the signal labeled F of FIG. 4 can be the output signal from the magnetic field sensor 120 of FIG. 4. Note that in the signal labeled F, the position of the desired spectral line has moved to DC.

FIGS. 24-26 show the above-described start up (i.e., power up) behavior of the magnetic field sensors 50, 120 of FIGS. 3 and 4, respectively, for the case where the magnetic field sensors are exposed to a DC magnetic field. FIGS. 23-24 of each show graphs having horizontal axes with scales in units of time and vertical axes with scales in units of voltage.

Referring now to FIG. 24, a signal is representative of the signal labeled F of FIGS. 3 and 4, i.e., the output signal of the magnetic field sensors. It can be seen that the output signal has undesirable spectral content for some time period beginning at time zero (i.e., power up) and extending out to about 0.4 milliseconds. This time period is determined by a variety factors, for example, transfer function characteristics of the integrators of FIGS. 3 and 4. It is desirable that this time be short.

Referring now to FIG. 25, a signal is representative of the signals labeled L and R of FIGS. 3 and 4, respectively. As described above, the signals labeled L and R are DC feedback signals, and they increase with time so as to cancel undesirable DC spectral components in the primary circuit path 112 of FIGS. 3 and 4.

Referring now to FIG. 26, a signal is representative of the signals labeled K and Q of FIGS. 3 and 4, respectively. As described above, the signals labeled K and Q have spectral content at a frequency of fc/2, and they increase with time so as to cancel undesirable spectral components at the frequency of fc/2 in the primary circuit path 112 of FIGS. 3 and 4.

It will be appreciated that, by using techniques described above to remove undesirable spectral components, the primary circuit path 112 of FIGS. 3 and 4 does not need to use filters after the primary circuit path. As described above, filters tend to slow the response time of magnetic field sensors. Thus, using the circuits and techniques described above, magnetic field sensors can be built that have faster response times. However, circuits and techniques described above are still limited in response time and bandwidth compared with circuits and techniques described below in conjunction with FIGS. 29-35.

Figure 27:
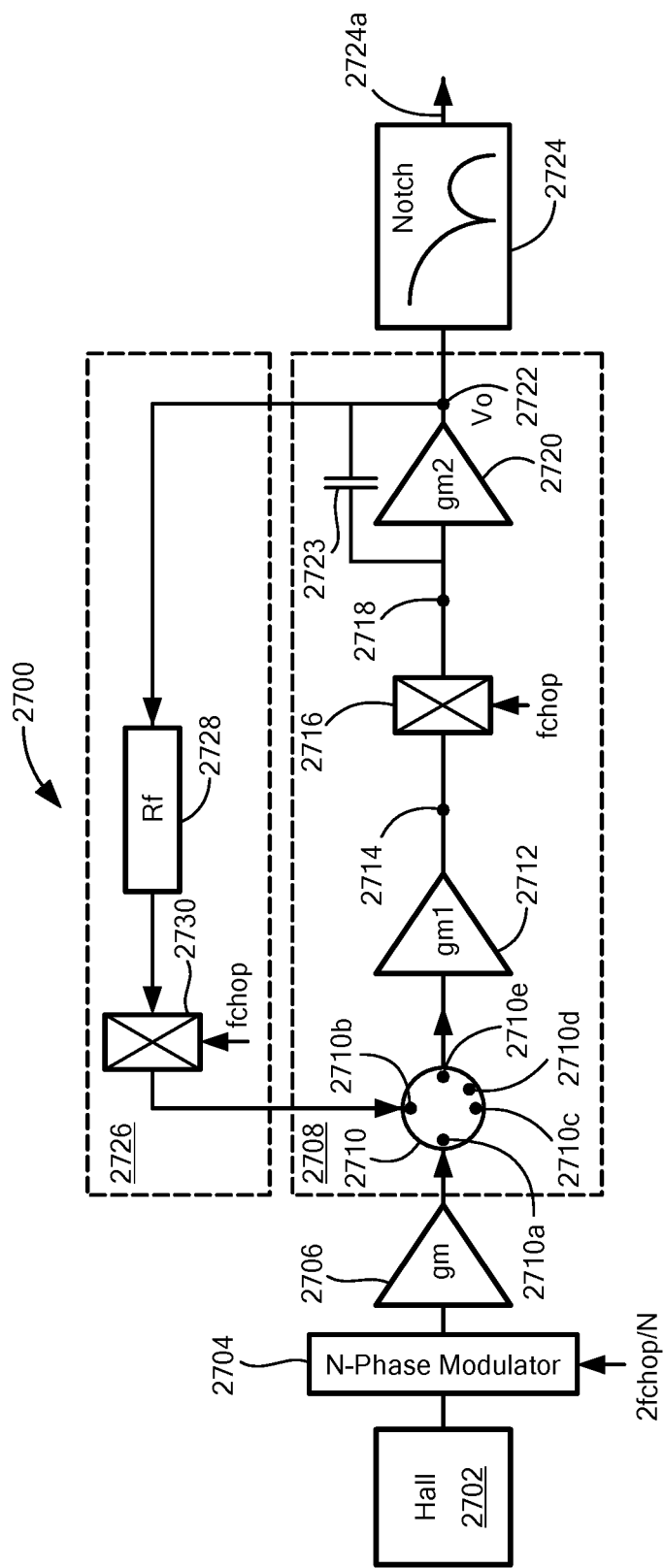
FIG. 27 is a block diagram showing another illustrative magnetic field sensor, having a primary signal path with a chopping circuit and amplifiers, having a Hall effect element used in a current spinning arrangement, and having a gain feedback network (i.e., circuit) configured to stabilize a gain of the magnetic field sensor.

Referring now to FIG. 27, a magnetic field sensor 2700 includes a primary circuit path 2708 and a gain feedback circuit 2726. Similar circuit components are described above in conjunction with FIGS. 3 and 4.

The magnetic field sensor 2700 can include a Hall element 2702 coupled to an N-phase modulator 2704 to generate a chopped signals. The Hall element 2702 and the N-phase modulator 2704 can be the same as or similar to the Hall element 52 and N-phase modulator 54 described in conjunction with FIGS. 3 and 4.

An amplifier 2706, can be coupled to the N-phase modulator 2704. The amplifier 2706 can be similar to the amplifier 56 of FIGS. 2 and 3. Amplifiers shown here and in figures below are shown to be transconductance amplifiers. However, in other embodiments, the transconductance amplifiers can be replaced by voltage amplifiers.

The primary circuit path 2708 can include a combining circuit 2710 coupled to the amplifier 2706. The combining circuit 2710 can include a plurality of input nodes 2710*a*,

2710*b*, 2710*c*, 2710*d* and an output node 2710*e*. Here, the input nodes 2710*c*, 2710*d* are not used, but are used in figures below. The combining circuit 2710 can be similar to the summing nodes 58, 60 of FIGS. 3 and 4.

An amplifier 2712 can be coupled to the output node 2710*e* of the combining circuit 2710. The amplifier 2712 can be similar to the amplifier 62 of FIGS. 3 and 4.

A modulator 2716 can be coupled to the amplifier 2712. The modulator 2716 can be similar to the modulator 64 of FIGS. 3 and 4.

An amplifier 2720 can be coupled to the modulator. The amplifier 2720 can be similar to the amplifier 66 of FIGS. 3 and 4.

A capacitor 2723 shown to be coupled across the amplifier is merely representative of a bandwidth reduction of the amplifier 2720 as would be obtained, for example, by a Miller capacitance, known in the art.

Nodes 2714, 2718 are referred to herein as "intermediate nodes" and are nodes between, the combining circuit output node 2710*e* and an output node 2722 of the amplifier 2720, but not including the combining circuit output node 2710*e* or the output node 2722. Additional intermediate nodes are shown in some figures below.

The gain feedback circuit 2726 is coupled between the output node 2722 of the amplifier and the input node 2710*b* of the combining circuit 2710. The gain feedback circuit 2726 can include a feedback circuit portion 2728 coupled to the output node 2722. The gain feedback circuit 2726 can also include a modulator 2730 coupled to the feedback circuit portion 2728.

It should be understood that the gain feedback circuit 2726 can operate to provide again stability to the primary circuit path 2708. The amplifiers 2712, 2720 tend to have high open loop gains. Negative feedback provided by the gain feedback circuit 2726 causes the overall combination of the primary circuit path 2708 and the gain feedback circuit 2726 to have a closed loop gain lower than the gains of the amplifiers 2712, 2720.

It is assumed herein that the input node 2710*b* is a negative input node, i.e., provides a negative combination at the combining circuit 2710. Stability of the magnetic field sensor 2700 can be provided if the closed loop gain, i.e., the gain of a signal at the input node 2710*b* becomes less than one before a phase of the signal received at the input node 2710*b* becomes one hundred and eighty degrees. In this way, positive feedback with gain greater than or equal to one does not occur at the input node 2710*b*. In order to achieve this result, a bandwidth of the amplifier 2720 is controlled, i.e., reduced, as indicated by the capacitor 2723.

As described in conjunction with FIGS. 1-26, due to the current spinning of the Hall element 2702 generated by the N-phase modulator 2704, signals within the primary signal path 2708 can include a desirable frequency (e.g., spectral band) component (i.e., a signal responsive to a measure magnetic field) and one or more undesirable frequency (e.g., spectral band) components. In conventional arrangements, one or more filters 2724 can be used to remove the undesirable frequency components. Techniques described above and below eliminate the need for the filter 2724. As described above, the filter tends to slow the response time of the magnetic field sensor 2700.

Figure 28:
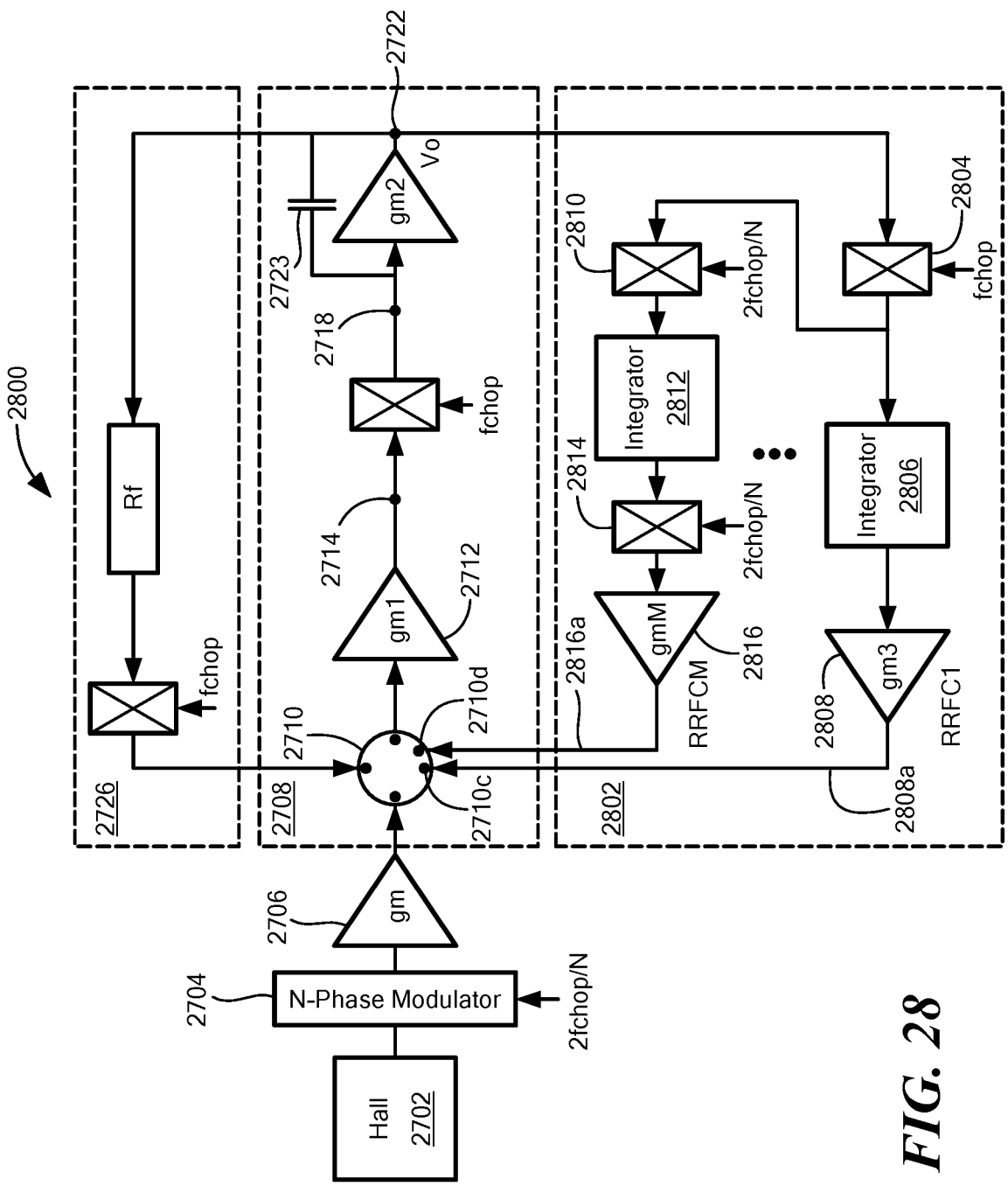
FIG. 28 is a block diagram showing another illustrative magnetic field sensor, having a primary signal path with a chopping circuit and amplifiers, having a Hall effect element used in a current spinning arrangement, having a gain feedback circuit, and having a ripple reduction feedback network configured to reduce undesirable spectral components that results from the current spinning and chopping with amplifying operations.

Referring now to FIG. 28, in which like elements of FIG. 27 are shown having like reference designations, a magnetic field sensor 2800 can include the primary circuit path 2708 and the gain feedback circuit 2726. The magnetic field sensor 2800 also includes a ripple reduction feedback network 2802 having one or more ripple reduction feedback circuits. The ripple reduction feedback network 2802 can also be seen in conjunction with FIG. 4, but is here show in a slightly different format. The graphs of FIGS. 6-23 showing signal modulations and frequency translations apply to the magnetic field sensor 2800.

A first ripple reduction feedback circuit can include a modulator 2804 having an input coupled to the output node 2722, an integrator 2806 having an input coupled to an output of the modulator 2804, and an amplifier 2802 having an input coupled to an output of the integrator 2806. A second ripple reduction feedback circuit can include a modulator 2810 having an input coupled to the output of the modulator 2804, an integrator 2812 having an input coupled to an output of the modulator 2810, a modulator 2814 having an input coupled to an output of the integrator 2812, and an amplifier 2816 having an input coupled to an output of modulator 2814.

As described above in conjunction with FIGS. 3 and 4, there can be M feedback circuits.

Integrators 2806, 2812 can be integrators of types described in conjunction with integrators 78, 84, 124, 130 of FIGS. 3 and 4. The integrators 2806, 2812 can be continuous time integrators or notch filter integrators.

Unlike FIG. 4, an amplifier 2808 provides a first ripple reduction feedback signal 2808*a* and an amplifier 2816 provides a second ripple reduction feedback signal 2816*a* coupled to the input nodes 2710*c*, 2710*d*, respectively of the combining circuit 2710, whereas, in FIG. 4, those amplifiers are not shown explicitly. However, it should be understood that any gain (positive, negative, or zero, as long as the overall ripple reduction loop remains negative) associated with the amplifiers 2808, 2816 can instead be within the integrators 2806, 2812, respectively, in which case, the amplifiers 2808, 2816 can be removed.

It is assumed herein that the input nodes 2710*c*, 2710*d* are negative input nodes, i.e., each provide a negative combination at the combining circuit 2710.

As described in conjunction with FIGS. 1-26, due to the current spinning of the Hall element 2702 generated by the N-phase modulator 2704, signals within the primary signal path 2708 can include a desirable frequency component (i.e., a signal responsive to a measure magnetic field) and one or more undesirable frequency components.

As described in conjunction with FIGS. 4, and 6-23, each ripple reduction feedback circuit, i.e., each ripple reduction signal 2808*a*, 2816*a* in the ripple reduction feedback network 2802, can cancel a selected one of the one or more undesirable frequency components from the primary circuit path 2708.

While more than one ripple reduction feedback circuit is shown in the ripple reduction network 2802, in other embodiments, the ripple reduction feedback network 2802 can have only one ripple reduction feedback circuit, for example, circuit elements 2804, 2806, 2808.

Figure 29:
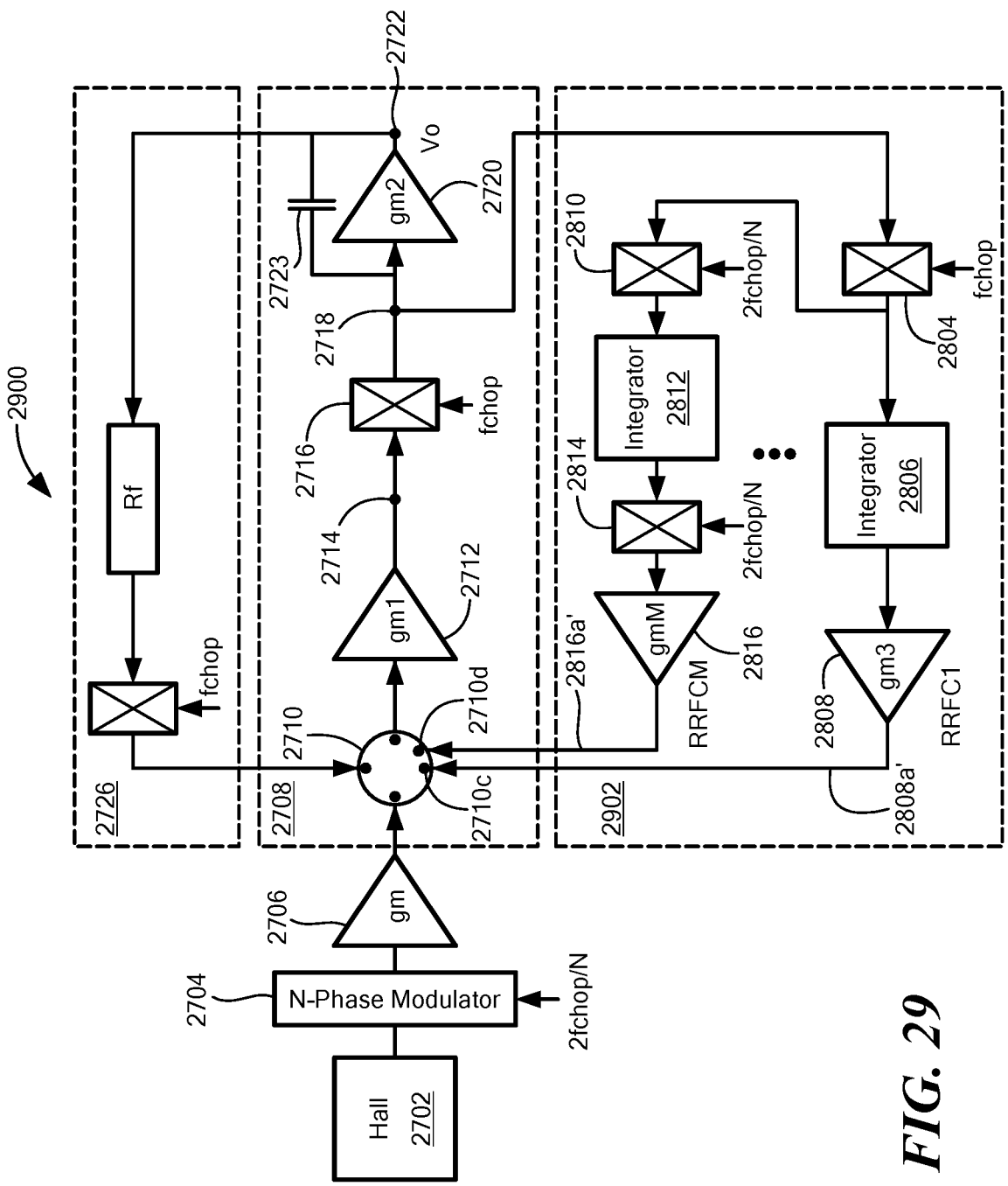
FIG. 29 is a block diagram showing another illustrative magnetic field sensor, having a primary signal path with a chopping circuit and amplifiers, having a Hall effect element used in a current spinning arrangement, having a gain feedback circuit, and having a ripple reduction feedback network configured to reduce undesirable spectral components that results from the current spinning and chopping with amplifying operations.

Referring now to FIG. 29, in which like elements of FIGS. 27 and 28 are shown having like reference designations, a magnetic field sensor 2900 can be similar to the magnetic field sensor 2800 of FIG. 28. The magnetic field sensor 2900 can include the primary signal path 2708, the gain feedback circuit 2726, and a ripple reduction feedback network 2902. Here, however, the ripple reduction feedback network 2902 is coupled between the intermediate node 2718 and the input nodes 2710*c*, 2710*d*.

This arrangement provides ripple reduction signals 2808*a'*, 2816*a'*, which are similar to signals 2808*a*, 2816*a* of FIG. 28 and are indicated by asterisks merely to indicate a slight difference.

With this arrangement coupled to the intermediate node 2718, it should be recognized that the ripple reduction feedback network 2902 does not suffer a bandwidth reduction that would otherwise result if it were coupled to the output node 2722, wherein the bandwidth reduction would result from the bandwidth reduction of the amplifier 2720 represented by the capacitor 2723, necessary to maintain stability of the primary signal path 2708 in view of the gain feedback circuit 2726. Thus, the ripple reduction feedback network 2902 can more rapidly cancel the above-described undesirable frequency components, for example, upon a first power up or in response to a step of magnetic field experienced by the Hall Element 2702.

Furthermore, the rippled reduction feedback network 2902, being coupled before the amplifier 2720, has little of no impact of the stability of the primary circuit path 2708 in view of the gain feedback circuit 2726. The same is true of magnetic field sensors described below.

Figure 30:
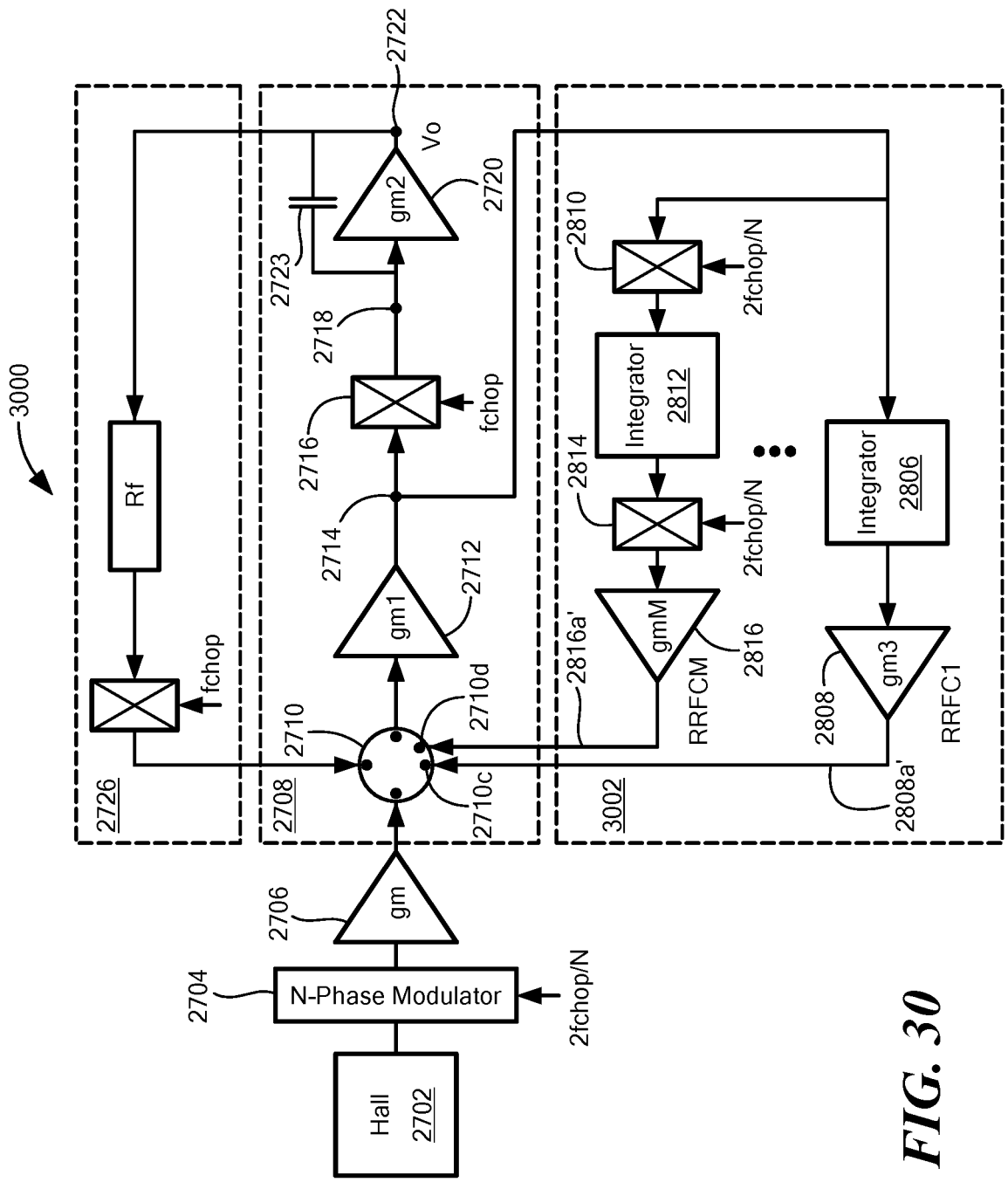
FIG. 30 is a block diagram showing another illustrative magnetic field sensor, having a primary signal path with a chopping circuit and amplifiers having a Hall effect element used in a current spinning arrangement, having a gain feedback circuit, and having a ripple reduction feedback network configured to reduce undesirable spectral components that results from the current spinning and chopping with amplifying operations.

Referring now to FIG. 30, in which like elements of FIGS. 27 and 28 are shown having like reference designations, a magnetic field sensor 3000 can be similar to the magnetic field sensor 2900 of FIG. 29. The magnetic field sensor 3000 can include the primary signal path 2708, the gain feedback circuit 2726, and a ripple reduction feedback network 3002. Here, however, the ripple reduction feedback network 3002 is coupled between the intermediate node 2714 and the input nodes 2710c, 2710d. Also, the modulator 2804 of FIG. 29 is not used.

The modulator 2804 can be removed due to the coupling to the intermediate node 2714, which omits the modulator 2716 from the path to the ripple reduction feedback network 3002. It is generally known that two modulators coupled in series and operating with the same modulation frequency, e.g., fchop, result in essentially the same signal appearing at the input of the two modulators and at the output of the two modulators. Thus, a pair of series coupled modulators operating with the same modulation frequency can be removed from a signal path with virtually no effect upon signals passing therethrough.

This arrangement provides ripple reduction signals 2808a', 2816a', which are the same as or similar to the signals 2808a', 2816a' of FIG. 29.

Figure 31:
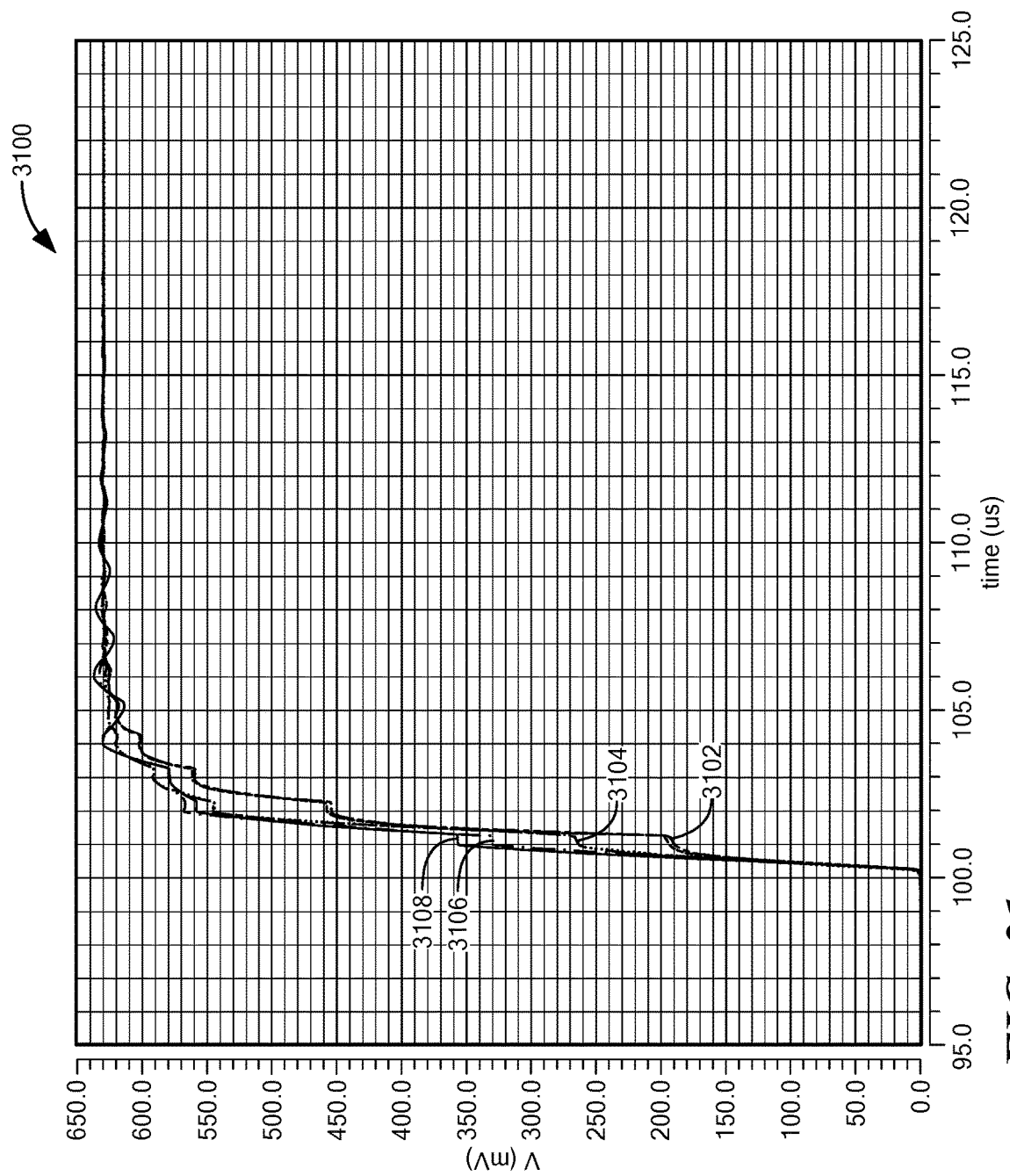
FIG. 31 is a graph showing an illustrative time behavior of one of the signals within the magnetic field sensors of FIGS. 29, 30 and 32 for a step input change of magnetic field.

Referring now to FIG. 31, a graph 3100 has a horizontal axis with a scale in units of time in microseconds and a vertical axis with a scale in units of voltage in millivolts.

Curves 3102, 3104, 3106, 3108 on the graph 3100 are indicative of voltages at the output node 2722 of FIGS. 29 and 30 in response to a step increase of magnetic field experienced by the Hall element 2702 and for which the ripple reduction feedback networks 2902, 3002 are coupled to intermediate nodes of the primary circuit path 2708. The four curves 3102, 3104, 3106, 3108 are illustrative of responses assuming there is one undesirable frequency component being canceled by one ripple reduction feedback circuit, e.g., circuit 2804, 2806, 2808 of FIG. 29. The four curves 3102, 3104, 3106, 3108 are illustrative of different values of the integrator poles (i.e., different corner frequencies) within the integrator 2806.

Graph 3100 shows a fast response time, faster than would be achieved by the magnetic field sensors of FIG. 3, 4 or 27, for which ripple reduction feedback networks are coupled to the output node 2722 of FIG. 27 or equivalent differential signals 66a, 66b or 66a', 66b' of FIGS. 3 and 4, respectively.

Figure 32:
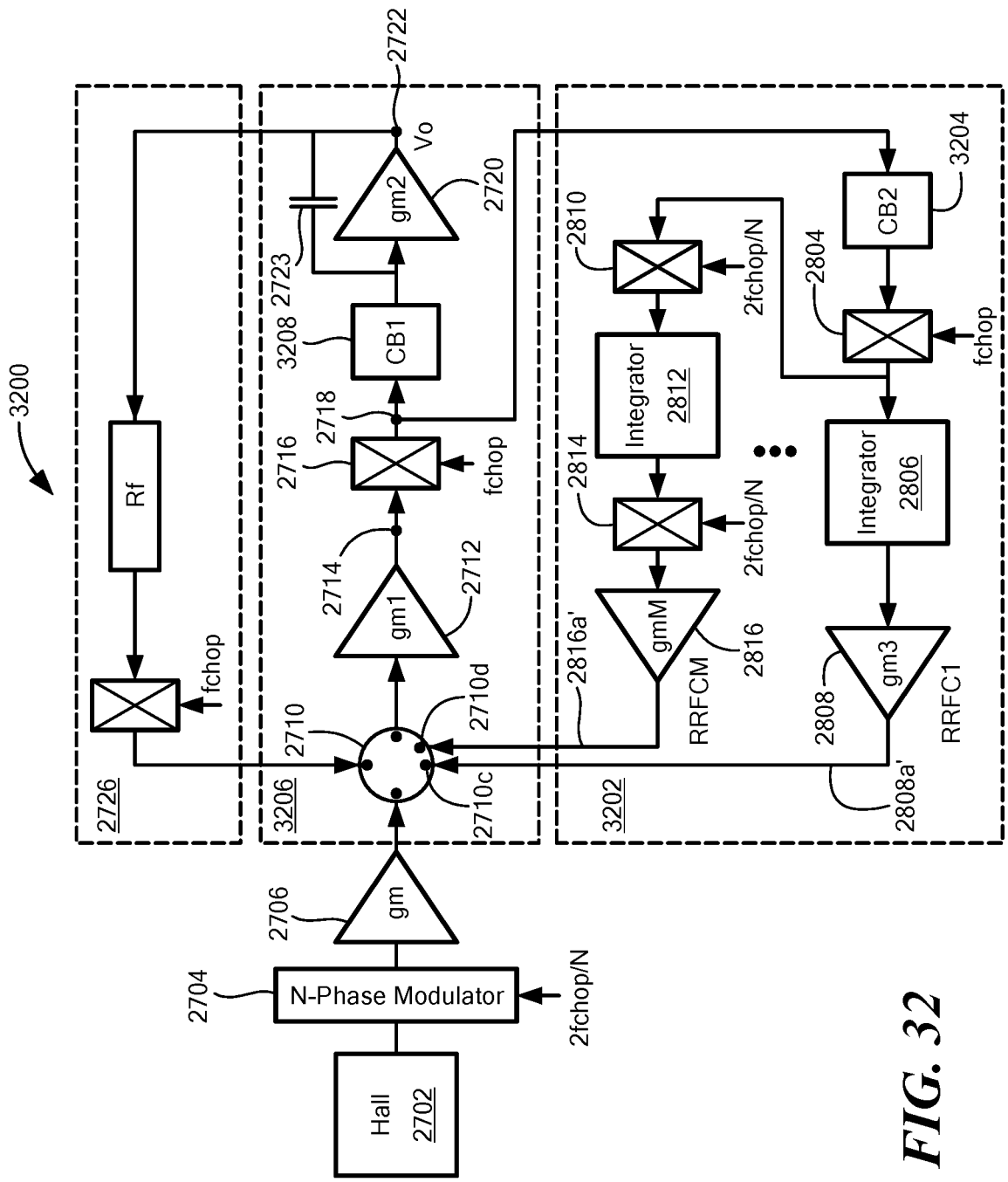
FIG. 32 is a block diagram showing another illustrative magnetic field sensor, having a primary signal path with a chopping circuit and amplifiers, having a Hall effect element used in a current spinning arrangement, having a gain feedback circuit, and having a ripple reduction feedback network configured to reduce undesirable spectral components that results from the current spinning and chopping with amplifying operations.

Referring now to FIG. 32, for which like elements of FIGS. 27 and 28 have like reference designations, a magnetic field sensor 3200 includes a primary circuit path 3206 that differs from the primary circuit path 2708 of FIGS. 27, 28, and 29 merely by addition of a current buffer circuit 3208 coupled between the modulator 2716 and the amplifier 2720.

The magnetic field sensor 3200 includes the gain feedback circuit 2726.

The magnetic field sensor 3200 can include a ripple reduction feedback network 3202 that is like the ripple reduction feedback network 2902 of FIG. 29 and is similarly coupled to the intermediate node 2718. Unlike the ripple reduction feedback network 2902, the ripple reduction network 3202 can have a current buffer 3204.

The current buffers 3208, 3204 have little impact on the magnetic field sensor 3200 and thus, the magnetic field sensor 3200 operates like the magnetic field sensor 2900 of FIG. 29. However, the current buffers 3208, 3204 can add some undesirable offset voltages to the magnetic field sensor 3200, which can be reduced in conjunction with a circuit described below in conjunction with FIG. 34.

Figure 33:
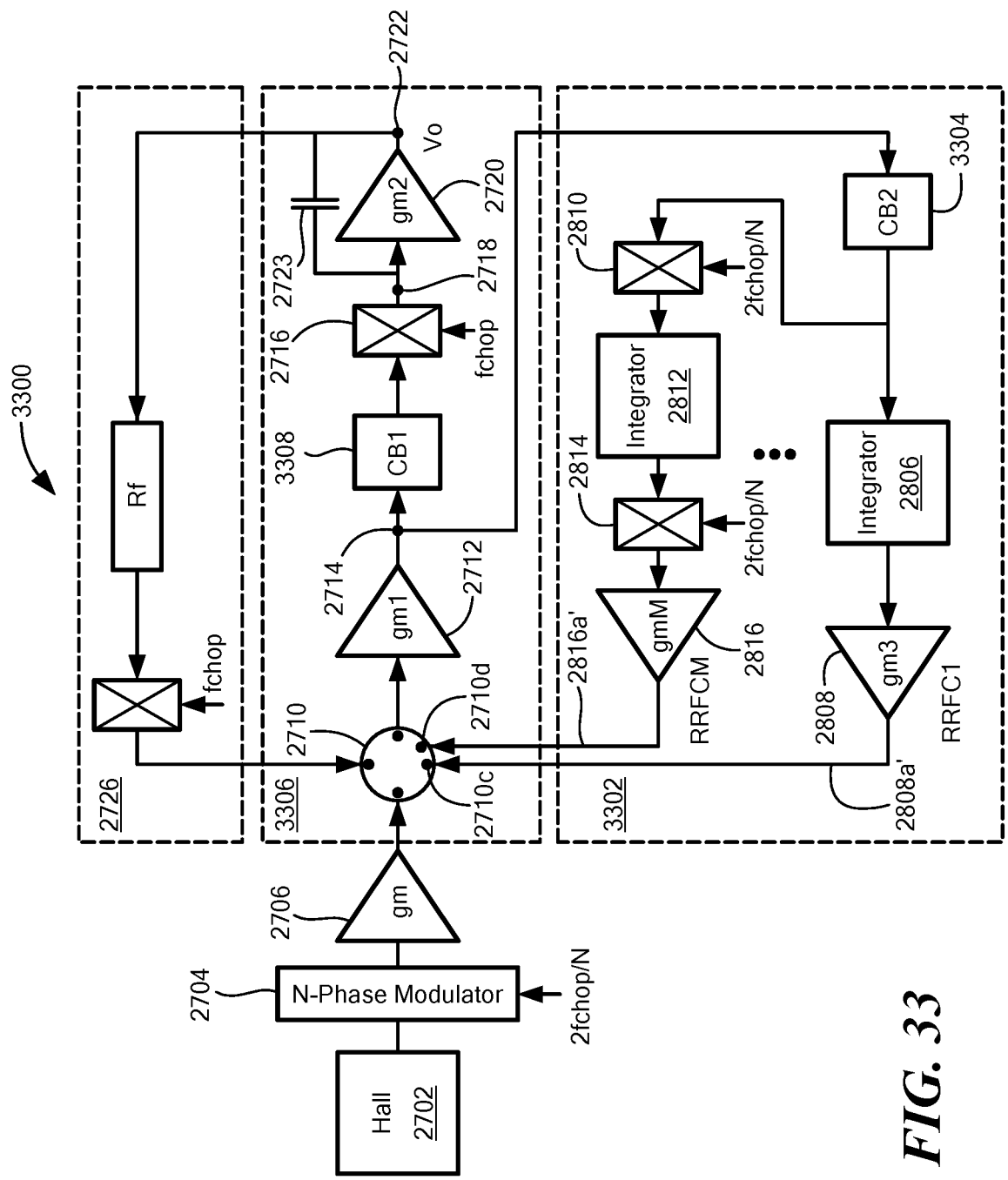
FIG. 33 is a block diagram showing another illustrative magnetic field sensor, having a primary signal path with a chopping circuit and amplifiers, having a Hall effect element used in a current spinning arrangement, having a gain feedback circuit, and having a ripple reduction feedback network configured to reduce undesirable spectral components that results from the current spinning and chopping with amplifying operations.

Referring now to FIG. 33, for which like elements of FIGS. 27 and 28 have like reference designations, a magnetic field sensor 3300 includes a primary circuit path 3206 that differs from the primary circuit path 2708 of FIGS. 27, 28, and 29 merely by addition of a current buffer circuit 3308 coupled between the amplifier 2712 and the modulator 2716.

The magnetic field sensor 3300 can include the gain feedback circuit 2726.

The magnetic field sensor 3300 can include a ripple reduction feedback network 3302 that is like the ripple reduction feedback network 3002 of FIG. 30 and is similarly coupled between the intermediate node 2714 and the input nodes 2710c, 2710d of the combining circuit 2710. Unlike the ripple reduction feedback network 3002, the ripple reduction network 3302 can have a current buffer 3304 coupled between the intermediate node 2714 and the integrator 2806 and the modulator 2810.

The current buffers 3308, 3304 have little impact on the magnetic field sensor 3300 and thus, the magnetic field sensor 3300 operates like the magnetic field sensor 2900 of FIG. 29. However, the current buffers 3308, 3304 can add some undesirable offset voltages to the magnetic field sensor 3300 which can be reduced in conjunction with a circuit described below in conjunction with FIG. 34.

Figure 34:
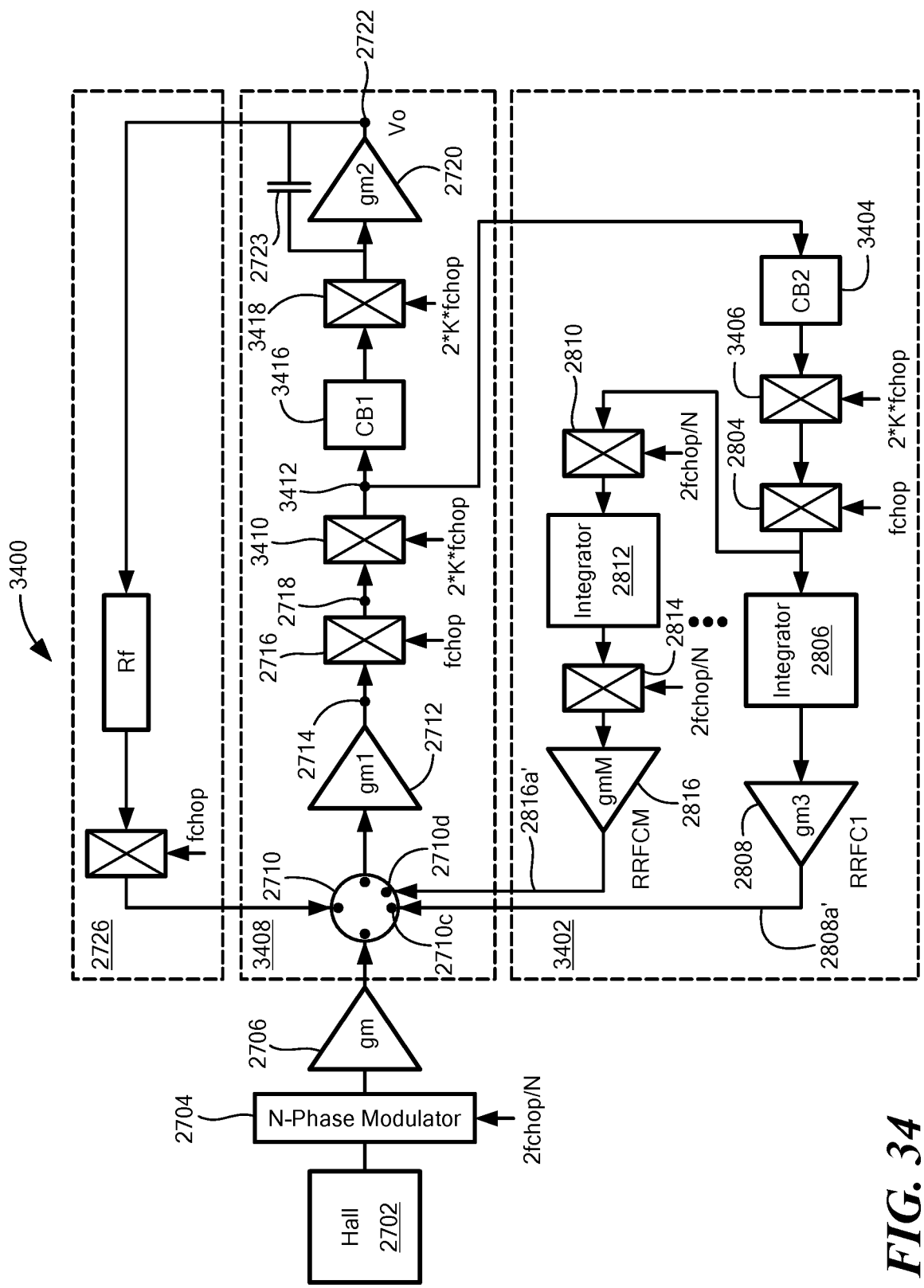
FIG. 34 is a block diagram showing another illustrative magnetic field sensor, having a primary signal path with a chopping circuit and amplifiers, having a Hall effect element used in a current spinning arrangement, having a gain feedback circuit, and having a ripple reduction feedback network configured to reduce undesirable spectral components that results from the current spinning and chopping and amplifying operations.

Referring now to FIG. 34, in which like elements of FIGS. 27 and 28 are shown having like reference designations, a magnetic field sensor 3400 includes a primary circuit path 3408 that differs from the primary circuit path 2708 of FIGS. 27, 28, 29 by addition of a current buffer 3416 surrounded by two additional modulators 3410, 3418 that operate at a higher modulation frequency 2Kfchop, and differ by notation of another intermediate node 3412 immediately following the modulator 3410.

The magnetic field sensor 3400 can include the gain feedback circuit 2726.

The magnetic field sensor 3400 can also include a ripple reduction feedback network 3402 that is like the ripple reduction feedback network 2902 of FIG. 29 but is coupled between to the intermediate node 3412 and the input nodes 2710c, 2710c of the combining circuit 2710. Unlike the ripple reduction feedback network 2902, the ripple reduction network 3202 can have a current buffer 3404 having an input coupled to the intermediate node 3412 and a modulator 3406 having an input coupled to an output of the current buffer 3404. An output of the modulator 3406 can be coupled to an input of the modulator 2804. The modulator 3406 can operate with the higher modulation frequency 2Kfchop of the modulators 3410, 3418.

The modulators 3410, 3418 surround the current buffer 3416 and operate to remove a DC offset voltage that would otherwise be generated by the current buffer 3416 and be passed through to the amplifier 2720. The modulators 3410, 3418 operate in essentially the same way as a chopper stabilized amplifier that uses the same techniques to remove an offset voltage from an amplifier. A desired frequency component is modulated to a higher frequency by operation of the modulator 3410 and the higher frequency desired frequency component is modulated back down to its original position in the frequency domain by operation of the modulator 3418. However, an offset voltage generated by the current buffer 3416 is modulated to a higher frequency by operation of the modulator 3418, where it remains, and where it can be removed.

The desired frequency component, having been modulated to a higher frequency is also modulated back down to its original position in the frequency domain by operation of the modulator 3406. Thus, the ripple reduction feedback circuit 3402 operates in much the same way as the ripple reduction feedback circuit 2902 of FIG. 29.

Figure 35:
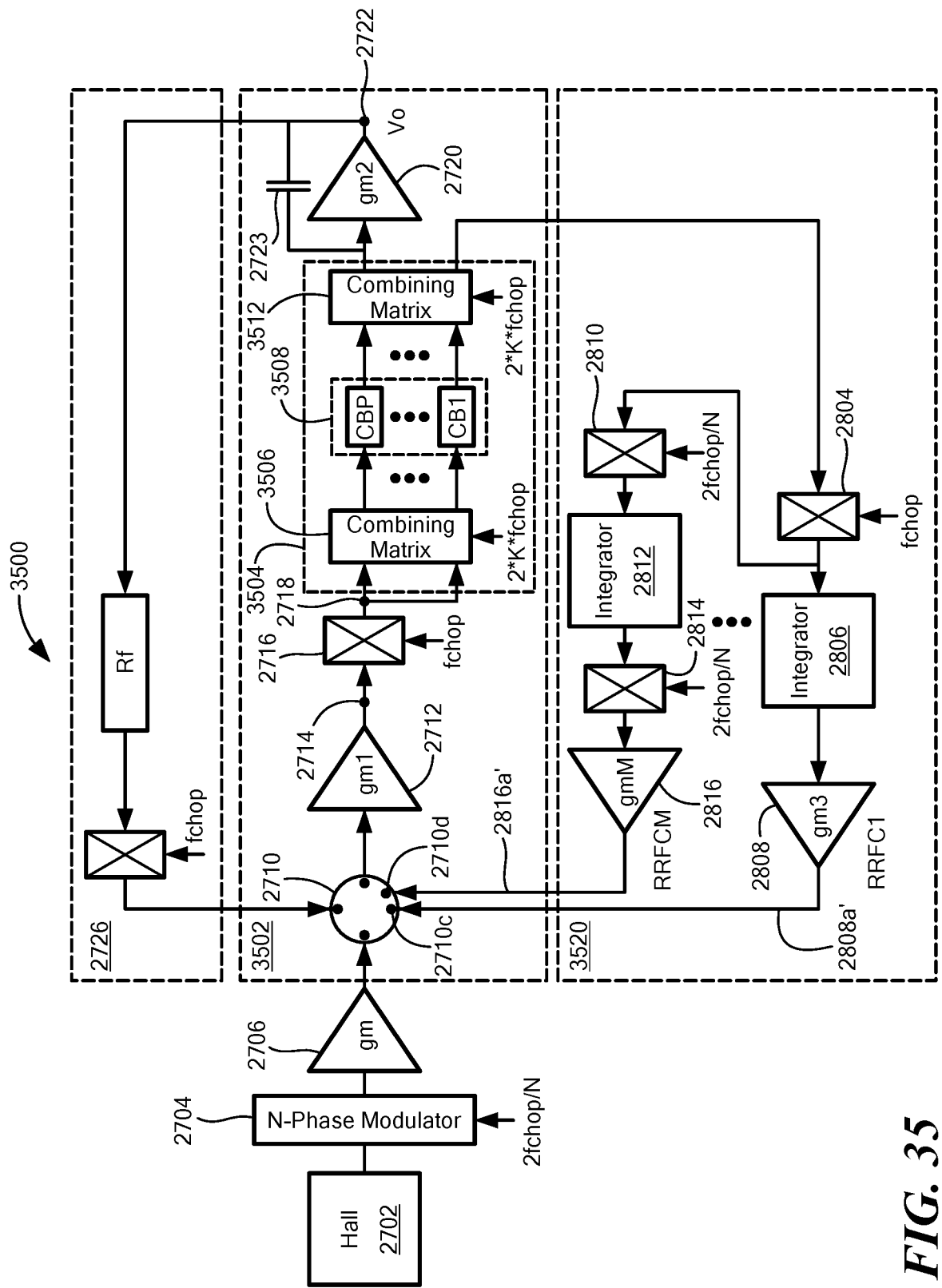
FIG. 35 is a block diagram showing another illustrative magnetic field sensor, having a primary signal path with a chopping circuit and amplifiers, having a Hall effect element used in a current spinning arrangement, having a gain feedback circuit, and having a ripple reduction feedback network configured to reduce undesirable spectral components that results from the current spinning and chopping and amplifying operations.

Referring now to FIG. 35, another magnetic field sensor 3500 includes a primary circuit path 3502 that differs from the primary circuit path 2708 of FIGS. 27, 28, 29 by addition of a shared circuit 3504 coupled between the modulator 2716 and the amplifier 2720.

The magnetic field sensor 3500 can include the gain feedback circuit 2726.

The magnetic field sensor 3500 can also include a ripple reduction feedback network 3520 that is the same as or similar to the ripple reduction feedback network 2902 of FIG. 29. Here, however, the ripple reduction feedback network 3520 is coupled to the intermediate node 2718 via the shared circuit 3504.

The shared circuit 3504 can include a first combining matrix 3506 (a switch matrix) coupled to receive a signal from the modulator 2716. The first combining matrix 3506 can provide a plurality of signals related to the signal from the modulator 2716 to a plurality of current buffers 3508. The plurality of current buffers 3508 can generate a plurality of buffered signals received by a second combining matrix 3512. The second combining circuit 3512 can provide two signals, one received by the amplifier 2720 and the other received by the ripple reduction feedback network 3520.

In operation, the shared circuit 3504 provides so-called dynamic element matching. In essence, different pairs of the plurality of current buffers 3508 pass the signal to the amplifier 2720 and to the ripple reduction feedback network 3520, changing pairs according to a modulation frequency 2Kfchop. In some embodiments, the frequency 2Kfchop is substantially higher than the frequency fchop.

With this arrangement, different offset voltages of the plurality of current buffers 3508 can be averaged, and the average can tend toward zero for randomly distributed offset voltages. Thus, any negative impact of the offset errors of the plurality of current buffers 3508 is reduced.

While the shared circuit 3504 is shown to be coupled between the intermediate node 2718 and the amplifier 2720, in other embodiments, the shared circuit 3504 can be coupled between the intermediate node 2714 and the modulator 2716. For these arrangements, the modulator 2804 can be removed in the same way that the modulator 2804 of FIG. 30 is removed.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A magnetic field sensor, comprising:
   a magnetic field sensing element configured to generate an electronic signal in response to a magnetic field;
   an N-phase modulator coupled to the electronic signal and configured to generate an N-phase modulated signal having a plurality of frequency components at different frequencies, wherein the plurality of frequency components comprises a first undesirable frequency component and a desirable frequency component, wherein the desirable frequency component comprises a magnetic field signal representative of the magnetic field;
   a primary circuit path, comprising:
      a combining module having a plurality of combining circuit input nodes and a combining circuit output node, a first one of the plurality of combining circuit input nodes coupled to a signal representative of the N-phase modulated signal;
      a primary circuit path output node, wherein an output signal representative of the magnetic field signal is generated at the primary circuit path output node; and
      a primary circuit path intermediate node, wherein the primary circuit path intermediate node is coupled between the combining circuit output node and the primary circuit path output node, the magnetic field sensor further comprising:
   a ripple reduction feedback network coupled between the primary circuit path intermediate node and the plurality of combining circuit input nodes, wherein the ripple reduction feedback network comprises a first ripple reduction feedback circuit configured to generate a first ripple reduction feedback signal coupled to a first one of the plurality of combining circuit input nodes, wherein the combining circuit is configured to add the first ripple reduction feedback signal to the primary circuit path to cancel the first undesirable frequency component from the primary circuit path.

2. The magnetic field sensor of claim 1, wherein, during a first time period, the output signal at the primary circuit path output node is representative of both the desirable frequency component and the first undesirable frequency component, and during a second time period after the first time period, the output signal at the primary circuit path output node is representative of the desirable frequency component and not the first undesirable frequency component.

3. The magnetic field sensor of claim 2, wherein a time difference between an end of the first time period and a beginning of the second time period corresponds to a ripple removal time, wherein the ripple removal time is not influenced by a closed loop bandwidth of the primary circuit path from the combining circuit to the primary circuit path output node.

4. The magnetic field sensor of claim 1, further comprising a gain feedback circuit coupled between the primary circuit path output node and a second one of the plurality of combining circuit input nodes, wherein the gain feedback circuit is configured to set a closed loop gain of the primary circuit path.

5. The magnetic field sensor of claim 4, wherein a closed loop stability of the primary circuit path is not determined by the ripple reduction feedback network.

6. The magnetic field sensor of claim 1, wherein the primary circuit path further comprises:
   a first primary circuit path amplifier having a first primary circuit path amplifier input node coupled to the combining circuit output node, the first primary circuit path amplifier also having a first primary circuit path amplifier output node at which a first amplified signal is generated;
   a primary circuit path modulator having a first primary circuit path modulator input node coupled to a signal representative of the first amplified signal, the primary circuit path modulator also having a first modulator output node at which a primary circuit path modulated signal is generated; and
   a second primary circuit path amplifier having a second primary circuit path amplifier input node coupled to a signal representative of the primary circuit path modulated signal, the second primary circuit path amplifier also having a second primary circuit path amplifier output node coupled to the primary circuit path output node.

7. The magnetic field sensor of claim 6, wherein the second primary circuit path amplifier comprise a bandwidth selected to result in a closed loop stability of the primary circuit path.

8. The magnetic field sensor of claim 6, wherein the primary circuit path further comprises:
   a modulated current buffer circuit, comprising:
      a first modulator coupled to receive the primary circuit path modulated signal and operable to generate a first modulated signal;
      a first current buffer coupled to receive the first modulated signal and operable to generate a first buffered signal;
      a second modulator coupled to receive the first buffered signal and operable to generate a second modulated signal received by the second primary circuit path amplifier;
      a second current buffer coupled to receive the first modulated signal and operable to generate a second buffered signal; and
      a third modulator coupled to receive the second buffered signal and operable to generate a third modulated signal received by the first ripple reduction feedback circuit.

9. The magnetic field sensor of claim 6, wherein the primary circuit path further comprises:
   a shared circuit, the shared circuit comprising:
      a first combining matrix having an input coupled to the primary circuit path intermediate node and operable to generate a plurality of signals;
      a plurality of current buffers coupled to receive the plurality of signals and operable to generate a plurality of buffered signals;
      a second combining matrix coupled to receive the plurality of buffered signals and operable to generate selected pairs of signals corresponding to selected pairs of the plurality of buffered signals, the selected pairs changing at a selection rate, wherein the second primary path amplifier r the primary circuit path modulator is coupled to receive one of each one of the selected pairs of signals and the ripple reduction feedback network is coupled to receive the other one of each one of the selected pairs of signals.

10. The magnetic field sensor of claim 1, wherein the first ripple reduction feedback circuit comprises:
    a first modulator coupled to the primary circuit path intermediate node and configured to generate a first modulated signal;
    a first integrator coupled to the first modulated signal and configured to generate a first integrated signal; and
    a first amplifier coupled to the first integrated signal and configured to generate the first ripple reduction feedback signal.

11. The magnetic field sensor of claim 10, wherein the first integrator comprises a switched capacitor integrator.

12. The magnetic field sensor of claim 10, wherein the first integrator comprises an N-phase switched capacitor notch filter integrator.

13. The magnetic field sensor of claim 10, wherein the first integrator comprises a continuous linear integrator.

14. The magnetic field sensor of claim 10, wherein the plurality of frequency components further comprises a second undesirable frequency component, wherein the ripple reduction feedback network further comprises a second ripple reduction feedback circuit configured to generate a second ripple reduction feedback signal coupled to a second one of the plurality of combining circuit input nodes, wherein the combining circuit is configured to add the second ripple reduction feedback signal to the primary circuit path to cancel the second undesirable frequency component from the primary circuit path, wherein the second ripple reduction feedback circuit comprises:
    a second modulator coupled to the first modulated signal and configured to generate a second modulated signal;
    a second integrator coupled to the second modulated signal and configured to generate a second integrated signal;
    a third modulator coupled to the second integrated signal and configured to generate a third modulated signal; and
    a second amplifier coupled to the third modulated signal and configured to generate the second ripple reduction feedback signal.

15. The magnetic field sensor of claim 14, wherein the magnetic field sensing element comprises a Hall effect element, and wherein the N-phase modulator comprises a current spinning circuit.

16. The magnetic field sensor of claim 15, wherein the current spinning circuit comprises a 4× current spinning circuit.

17. The magnetic field sensor of claim 1, wherein the first ripple reduction feedback circuit comprises:
    a first integrator coupled to the primary circuit path intermediate node and configured to generate a first integrated signal; and
    a first amplifier coupled to the first integrated signal and configured to generate the first ripple reduction feedback signal.

18. The magnetic field sensor of claim 17, wherein the first integrator comprises a switched capacitor integrator.

19. The magnetic field sensor of claim 17 wherein the first integrator comprises an N-phase switched capacitor notch filter integrator.

20. The magnetic field sensor of claim 17, wherein the first integrator comprises a continuous linear integrator.

21. The magnetic field sensor of claim 17, wherein the plurality of frequency components further comprises a second undesirable frequency component, wherein the ripple reduction feedback network further comprises a second ripple reduction feedback circuit configured to generate a second ripple reduction feedback signal coupled to a second one of the plurality of combining circuit input nodes, wherein the combining circuit is configured to add the second ripple reduction feedback signal to the primary circuit path to cancel the second undesirable frequency component from the primary circuit path, wherein the second ripple reduction feedback circuit comprises:
 a first modulator coupled to the primary circuit path intermediate node and configured to generate a first modulated signal;
 an integrator coupled to the first modulated signal and configured to generate a second integrated signal;
 a second modulator coupled to the second integrated signal and configured to generate a second modulated signal; and
 a second amplifier coupled to the second modulated signal and configured to generate the second ripple reduction feedback signal.

22. The magnetic field sensor of claim 21, wherein the magnetic field sensing element comprises a Hall effect element, and wherein the N-phase modulator comprises a current spinning circuit.

23. The magnetic field sensor of claim 22, wherein the current spinning circuit comprises a 4× current spinning circuit.

24. The magnetic field sensor of claim 1, wherein the primary circuit path further comprises an output amplifier having an output coupled to the primary circuit path output node, wherein the intermediate node is before the output amplifier, wherein the ripple reduction feedback network has a ripple reduction feedback network input coupled to the primary circuit path intermediate node, and wherein the ripple reduction feedback network has a plurality of ripple reduction feedback network outputs coupled to the plurality of combining circuit input nodes, respectively.

25. A method, comprising:
 generating an electronic signal with a magnetic field sensing element in response to a magnetic field;
 generating an N-phase modulated signal with an N-phase modulator, the N-phase modulated signal having a plurality of frequency components at different frequencies, wherein the plurality of frequency components comprises a first undesirable frequency component and a desirable frequency component, wherein the desirable frequency component comprises a magnetic field signal representative of the magnetic field;
 processing the N-phase modulated signal with a primary circuit path, the primary signal path comprising:
  a combining circuit having a plurality of combining circuit input nodes and a combining circuit output node, a first one of the plurality of combining circuit input nodes coupled to a signal representative of the N-phase modulated signal;
  a primary circuit path output node, wherein an output signal representative of the magnetic field signal is generated at the primary circuit path output node; and
  a primary circuit path intermediate node, wherein the primary circuit path intermediate node is coupled between the combining circuit output node and the primary circuit path output node, the method further comprising:
 generating, with a first ripple reduction feedback circuit within a ripple reduction feedback network coupled between the primary circuit path intermediate node and a first one of the plurality of combining circuit input nodes, a first ripple reduction feedback signal; and adding, with the combining circuit, the first ripple reduction feedback signal to the primary circuit path to cancel the first undesirable frequency component from the primary circuit path.

26. The method of claim 25, wherein, during a first time period, the output signal at the primary circuit path output node is representative of both the desirable frequency component and the first undesirable frequency component, and during a second time period after the first time period, the output signal at the primary circuit path output node is representative of the desirable frequency component and not the first undesirable frequency component.

27. The method of claim 26, wherein a time difference between an end of the first time period and a beginning of the second time period corresponds to a ripple removal time, wherein the ripple removal time is not influenced by a closed loop bandwidth of the primary circuit path from the combining circuit to the primary circuit path output node.

28. The method of claim 25, further comprising:
 setting a closed loop gain of the primary circuit path with a gain feedback circuit coupled between the primary circuit path output node and a second one of the plurality of combining circuit input nodes.

29. The method of claim 28, wherein a closed loop stability of the primary circuit path is not determined by the ripple reduction feedback network.

30. The method of claim 25, wherein the primary circuit path further comprises:
 a first primary circuit path amplifier having a first primary circuit path amplifier input node coupled to the combining circuit output node, the first primary circuit path amplifier also having a first primary circuit path amplifier output node at which a first amplified signal is generated;
 a primary circuit path modulator having a first primary circuit path modulator input node coupled to a signal representative of the first amplified signal, the primary circuit path modulator also having a first modulator output node at which a primary circuit path modulated signal is generated; and
 a second primary circuit path amplifier having a second primary circuit path amplifier input node coupled to a signal representative of the primary circuit path modulated signal, the second primary circuit path amplifier also having a second primary circuit path amplifier output node coupled to the primary circuit path output node, wherein primary circuit path primary circuit path intermediate node is the same as a selected one of the first primary circuit path amplifier output node, the first modulator output node, or the second primary circuit path amplifier output node.

31. The method of claim 30, wherein the second primary circuit path amplifier comprises a bandwidth selected to result in a closed loop stability of the primary circuit path.

32. The method of claim 30, wherein the primary circuit path further comprises:
 a modulated current buffer circuit, comprising:
  a first modulator coupled to receive the primary circuit path modulated signal and operable to generate a first modulated signal;
  a first current buffer coupled to receive the first modulated signal and operable to generate a first buffered signal;
  a second modulator coupled to receive the first buffered signal and operable to generate a second modulated signal received by the second primary circuit path amplifier;

a second current buffer coupled to receive the first modulated signal and operable to generate a second buffered signal; and a third modulator coupled to receive the second buffered signal and operable to generate a third modulated signal received by the first ripple reduction feedback circuit.

33. The method of claim 30, wherein the primary circuit path further comprises:

a shared circuit, the shared circuit comprising:

a first combining matrix having an input coupled to the primary circuit path intermediate node and operable to generate a plurality of signals;

a plurality of current buffers coupled to receive the plurality of signals and operable to generate a plurality of buffered signals;

a second combining matrix coupled to receive the plurality of buffered signals and operable to generate selected pairs of signals corresponding to selected pairs of the plurality of buffered signals, the selected pairs changing at a selection rate, wherein the second primary path amplifier r the primary circuit path modulator is coupled to receive one of each one of the selected pairs of signals and the ripple reduction feedback network is coupled to receive the other one of each one of the selected pairs of signals.

34. The method of claim 25, wherein the first ripple reduction feedback circuit comprises:

a first modulator coupled to the primary circuit path intermediate node and configured to generate a first modulated signal;

a first integrator coupled to the first modulated signal and configured to generate a first integrated signal; and a first amplifier coupled to the first integrated signal and configured to generate the first ripple reduction feedback signal.

35. The method of claim 34, wherein the first integrator comprises a switched capacitor integrator.

36. The method of claim 34, wherein the first integrator comprises an N-phase switched capacitor notch filter integrator.

37. The method of claim 34, wherein the first integrator comprises a continuous linear integrator.

38. The method of claim 34, wherein the plurality of frequency components further comprises a second undesirable frequency component, wherein the ripple reduction feedback network further comprises a second ripple reduction feedback circuit configured to generate a second ripple reduction feedback signal coupled to a second one of the plurality of combining circuit input nodes, wherein the combining circuit is configured to add the second ripple reduction feedback signal to the primary circuit path to cancel the second undesirable frequency component from the primary circuit path, wherein the second ripple reduction feedback circuit comprises:

a second modulator coupled to the first modulated signal and configured to generate a second modulated signal;

a second integrator coupled to the second modulated signal and configured to generate a second integrated signal;

a third modulator coupled to the second integrated signal and configured to generate a third modulated signal; and a second amplifier coupled to the third modulated signal and configured to generate the second ripple reduction feedback signal.

39. The method of claim 38, wherein the magnetic field sensing element comprises a Hall effect element, and wherein the N-phase modulator comprises a chopping circuit.

40. The method of claim 39, wherein the chopping circuit comprises a 4× chopping circuit.

41. The method of claim 25, wherein the first ripple reduction feedback circuit comprises:

a first integrator coupled to the primary circuit path intermediate node and configured to generate a first integrated signal; and a first amplifier coupled to the first integrated signal and configured to generate the first ripple reduction feedback signal.

42. The method of claim 41, wherein the first integrator comprises a switched capacitor integrator.

43. The method of claim 41 wherein the first integrator comprises an N-phase switched capacitor notch filter integrator.

44. The method of claim 41, wherein the first integrator comprises a continuous linear integrator.

45. The method of claim 41, wherein the plurality of frequency components further comprises a second undesirable frequency component, wherein the ripple reduction feedback network further comprises a second ripple reduction feedback circuit configured to generate a second ripple reduction feedback signal coupled to a second one of the plurality of combining circuit input nodes, wherein the combining circuit is configured to add the second ripple reduction feedback signal to the primary circuit path to cancel the second undesirable frequency component from the primary circuit path, wherein the second ripple reduction feedback circuit comprises:

a first modulator coupled to the primary circuit path intermediate node and configured to generate a first modulated signal;

an integrator coupled to the first modulated signal and configured to generate a second integrated signal;

a second modulator coupled to the second integrated signal and configured to generate a second modulated signal; and a second amplifier coupled to the second modulated signal and configured to generate the second ripple reduction feedback signal.

46. The method of claim 45, wherein the magnetic field sensing element comprises a Hall effect element, and wherein the N-phase modulator comprises a current spinning circuit.

47. The method of claim 46, wherein the current spinning circuit comprises a 4× current spinning circuit.

48. The method of claim 25, wherein the primary circuit path further comprises an output amplifier having an output coupled to the primary circuit path output node, wherein the intermediate node is before the output amplifier, wherein the ripple reduction feedback network has a ripple reduction feedback network input coupled to the primary circuit path intermediate node, and wherein the ripple reduction feedback network has a plurality of ripple reduction feedback network outputs coupled to the plurality of combining circuit input nodes, respectively.

49. A magnetic field sensor, comprising:

means for generating an electronic signal with a magnetic field sensing element in response to a magnetic field;

means for generating an N-phase modulated signal with an N-phase modulator, the N-phase modulated signal having a plurality of frequency components at different frequencies, wherein the plurality of frequency components comprises a first undesirable frequency component and a desirable frequency component, wherein the desirable frequency component comprises a magnetic field signal representative of the magnetic field;

means for processing the N-phase modulated signal with a primary circuit path, the primary signal path comprising:
- a combining circuit having a plurality of combining circuit input nodes and a combining circuit output node, a first one of the plurality of combining circuit input nodes coupled to a signal representative of the N-phase modulated signal;
- a primary circuit path output node, wherein an output signal representative of the magnetic field signal is generated at the primary circuit path output node; and
- a primary circuit path intermediate node, wherein the primary circuit path intermediate node is coupled between the combining circuit output node and the primary circuit path output node, the magnetic field sensor further comprising:

means for generating, with a first ripple reduction feedback circuit within a ripple reduction feedback network coupled between the primary circuit path intermediate node and a first one of the plurality of combining circuit input nodes, a first ripple reduction feedback signal; and means for adding, with the combining circuit, the first ripple reduction feedback signal to the primary circuit path to cancel the first undesirable frequency component from the primary circuit path.

50. The magnetic field sensor of claim 49, wherein the primary circuit path further comprises an output amplifier having an output coupled to the primary circuit path output node, wherein the intermediate node is before the output amplifier, wherein the ripple reduction feedback network has a ripple reduction feedback network input coupled to the primary circuit path intermediate node, and wherein the ripple reduction feedback network has a plurality of ripple reduction feedback network outputs coupled to the plurality of combining circuit input nodes, respectively.

\* \* \* \* \*

UNITED STATES PATENT AND TRADEMARK OFFICE
CERTIFICATE OF CORRECTION

| | | |
|---|---|---|
| PATENT NO. | : 11,047,933 B2 | |
| APPLICATION NO. | : 16/372603 | |
| DATED | : June 29, 2021 | |
| INVENTOR(S) | : Hernán D. Romero et al. | |

It is certified that error appears in the above-identified patent and that said Letters Patent is hereby corrected as shown below:

In the Specification

Column 4, Line 31 delete "FIGS. 6-23 graphs" and replace with --FIGS. 6-23 show graphs--.

Column 5, Line 47 delete "operations;" and replace with --operations.--.

Column 9, Line 4 delete "of a four" and replace with --of the four--.

Column 11, Line 3 delete "72a, 74" and replace with --72a, 74a--.

Column 15, Line 43 delete "(an also" and replace with --(and also--.

Column 17, Line 9 delete "FIG. F" and replace with --FIG. 3--.

Column 21, Line 15 delete "little of" and replace with --little or--.

Column 21, Line 16 delete "impact of the" and replace with --impact on the--.

Column 21, Line 60 delete "FIG. 3, 4 or 27" and replace with --FIGS. 3, 4 or 27--.

Column 22, Line 57 delete "2710c, 2710c" and replace with --2710c, 2710d--.

Signed and Sealed this
Eleventh Day of July, 2023

Katherine Kelly Vidal
*Director of the United States Patent and Trademark Office*